US008933650B2

(12) United States Patent
O'Neal, III et al.

(10) Patent No.: US 8,933,650 B2
(45) Date of Patent: Jan. 13, 2015

(54) MATCHING A RESONANT FREQUENCY OF A RESONANT CAVITY TO A FREQUENCY OF AN INPUT VOLTAGE

(75) Inventors: Charles D. O'Neal, III, Bolton, MA (US); Adam C. Molzahn, Leominster, MA (US); John J. Vincent, Williamstown, MI (US)

(73) Assignee: Mevion Medical Systems, Inc., Littleton, MA (US)

( * ) Notice: Subject to any disclaimer, the term of this patent is extended or adjusted under 35 U.S.C. 154(b) by 1151 days.

(21) Appl. No.: 11/948,359

(22) Filed: Nov. 30, 2007

(65) Prior Publication Data
US 2009/0140671 A1    Jun. 4, 2009

(51) Int. Cl.
*H05H 13/02*    (2006.01)
*H03L 7/00*    (2006.01)

(52) U.S. Cl.
CPC . *H05H 13/02* (2013.01); *H03L 7/00* (2013.01)
USPC .............................. 315/502; 315/507; 313/62

(58) Field of Classification Search
USPC .............. 315/501–503, 507; 250/423 R, 424, 250/396 R; 313/62
See application file for complete search history.

(56) References Cited

U.S. PATENT DOCUMENTS

| | | | |
|---|---|---|---|
| 2,280,606 A | 4/1942 | Van et al. | |
| 2,492,324 A | 12/1949 | Salisbury | |
| 2,615,129 A | 10/1952 | McMillan | |
| 2,616,042 A | 10/1952 | Weeks | |
| 2,659,000 A | 11/1953 | Salisbury | |
| 2,701,304 A | 2/1955 | Dickinson | |
| 2,789,222 A | 4/1957 | Marin et al. | |
| 3,175,131 A | 3/1965 | Burleigh et al. | |
| 3,432,721 A | * | 3/1969 | Naydan et al. |
| 3,582,650 A | 6/1971 | Avery | |
| 3,679,899 A | 7/1972 | Dimeff | |
| 3,689,847 A | 9/1972 | Verster | |
| 3,757,118 A | 9/1973 | Hodge et al. | |
| 3,868,522 A | 2/1975 | Bigham et al. | |
| 3,886,367 A | 5/1975 | Castle, Jr. | |
| 3,925,676 A | 12/1975 | Bigham et al. | |

(Continued)

FOREIGN PATENT DOCUMENTS

| | | |
|---|---|---|
| AU | 2005267078 | 7/2009 |
| CA | 2629333 | 5/2007 |

(Continued)

OTHER PUBLICATIONS

Office action and response history of U.S. Appl. No. 11/601,056 up to Jan. 14, 2010.

(Continued)

*Primary Examiner* — Jimmy Vu
*Assistant Examiner* — Amy Yang
(74) *Attorney, Agent, or Firm* — Fish & Richardson P.C.

(57) ABSTRACT

A synchrocyclotron includes magnetic structures that define a resonant cavity, a source to provide particles to the resonant cavity, a voltage source to provide radio frequency (RF) voltage to the resonant cavity, a phase detector to detect a difference in phase between the RF voltage and a resonant frequency of the resonant cavity that changes over time, and a control circuit, responsive to the difference in phase, to control the voltage source so that a frequency of the RF voltage substantially matches the resonant frequency of the resonant cavity.

22 Claims, 6 Drawing Sheets

(56) References Cited

U.S. PATENT DOCUMENTS

| | | |
|---|---|---|
| 3,955,089 A | 5/1976 | McIntyre et al. |
| 3,958,327 A | 5/1976 | Marancik et al. |
| 3,992,625 A | 11/1976 | Schmidt et al. |
| 4,038,622 A | 7/1977 | Purcell |
| 4,047,068 A | 9/1977 | Ress et al. |
| 4,112,306 A * | 9/1978 | Nunan |
| 4,129,784 A | 12/1978 | Tschunt et al. |
| 4,139,777 A * | 2/1979 | Rautenbach |
| 4,197,510 A | 4/1980 | Szu |
| 4,220,866 A | 9/1980 | Taumann et al. |
| 4,230,129 A | 10/1980 | LeVeen |
| 4,256,966 A | 3/1981 | Heinz |
| 4,293,772 A | 10/1981 | Stieber |
| 4,336,505 A * | 6/1982 | Meyer |
| 4,342,060 A | 7/1982 | Gibson |
| 4,345,210 A | 8/1982 | Tran |
| 4,353,033 A | 10/1982 | Karasawa |
| 4,425,506 A | 1/1984 | Brown et al. |
| 4,490,616 A | 12/1984 | Cipollina et al. |
| 4,507,614 A | 3/1985 | Prono et al. |
| 4,507,616 A | 3/1985 | Blosser et al. |
| 4,589,126 A | 5/1986 | Augustsson et al. |
| 4,598,208 A | 7/1986 | Brunelli et al. |
| 4,628,523 A | 12/1986 | Heflin |
| 4,633,125 A | 12/1986 | Blosser et al. |
| 4,641,057 A * | 2/1987 | Blosser et al. |
| 4,641,104 A | 2/1987 | Blosser et al. |
| 4,651,007 A | 3/1987 | Perusek et al. |
| 4,680,565 A | 7/1987 | Jahnke |
| 4,705,955 A | 11/1987 | Mileikowsky |
| 4,710,722 A | 12/1987 | Jahnke |
| 4,726,046 A | 2/1988 | Nunan |
| 4,734,653 A | 3/1988 | Jahnke |
| 4,737,727 A | 4/1988 | Yamada et al. |
| 4,739,173 A | 4/1988 | Blosser et al. |
| 4,745,367 A | 5/1988 | Dustmann et al. |
| 4,754,147 A | 6/1988 | Maughan et al. |
| 4,763,483 A | 8/1988 | Olsen |
| 4,767,930 A | 8/1988 | Stieber et al. |
| 4,769,623 A | 9/1988 | Marsing et al. |
| 4,771,208 A | 9/1988 | Jongen et al. |
| 4,783,634 A | 11/1988 | Yamamoto et al. |
| 4,808,941 A | 2/1989 | Marsing |
| 4,812,658 A | 3/1989 | Koehler |
| 4,843,333 A | 6/1989 | Marsing et al. |
| 4,845,371 A | 7/1989 | Stieber |
| 4,865,284 A | 9/1989 | Gosis et al. |
| 4,868,843 A | 9/1989 | Nunan |
| 4,868,844 A | 9/1989 | Nunan |
| 4,870,287 A | 9/1989 | Cole et al. |
| 4,880,985 A | 11/1989 | Jones |
| 4,894,541 A | 1/1990 | Ono |
| 4,896,206 A | 1/1990 | Denham |
| 4,902,993 A | 2/1990 | Krevet |
| 4,904,949 A | 2/1990 | Wilson |
| 4,905,267 A | 2/1990 | Miller et al. |
| 4,917,344 A | 4/1990 | Prechter et al. |
| 4,943,781 A | 7/1990 | Wilson et al. |
| 4,945,478 A | 7/1990 | Merickel et al. |
| 4,968,915 A | 11/1990 | Wilson et al. |
| 4,987,309 A | 1/1991 | Klasen et al. |
| 4,992,744 A | 2/1991 | Fujita et al. |
| 4,996,496 A | 2/1991 | Kitamura et al. |
| 5,006,759 A | 4/1991 | Krispel |
| 5,010,562 A | 4/1991 | Hernandez et al. |
| 5,012,111 A | 4/1991 | Ueda |
| 5,017,789 A | 5/1991 | Young et al. |
| 5,017,882 A | 5/1991 | Finlan |
| 5,036,290 A | 7/1991 | Sonobe et al. |
| 5,039,057 A | 8/1991 | Prechter et al. |
| 5,039,867 A | 8/1991 | Nishihara et al. |
| 5,046,078 A | 9/1991 | Hernandez et al. |
| 5,072,123 A | 12/1991 | Johnsen |
| 5,111,042 A | 5/1992 | Sullivan et al. |
| 5,111,173 A | 5/1992 | Matsuda et al. |
| 5,117,194 A | 5/1992 | Nakanishi et al. |
| 5,117,212 A | 5/1992 | Yamamoto et al. |
| 5,117,829 A | 6/1992 | Miller et al. |
| 5,148,032 A | 9/1992 | Hernandez |
| 5,166,531 A | 11/1992 | Huntzinger |
| 5,189,687 A | 2/1993 | Bova et al. |
| 5,191,706 A | 3/1993 | Cosden |
| 5,240,218 A | 8/1993 | Dye |
| 5,260,579 A | 11/1993 | Yasuda et al. |
| 5,260,581 A | 11/1993 | Lesyna et al. |
| 5,278,533 A | 1/1994 | Kawaguchi |
| 5,285,166 A | 2/1994 | Hiramoto et al. |
| 5,317,164 A | 5/1994 | Kurokawa |
| 5,336,891 A | 8/1994 | Crewe |
| 5,341,104 A | 8/1994 | Anton et al. |
| 5,349,198 A | 9/1994 | Takanaka |
| 5,365,742 A | 11/1994 | Boffito et al. |
| 5,374,913 A | 12/1994 | Pissantezky et al. |
| 5,382,914 A | 1/1995 | Hamm et al. |
| 5,401,973 A | 3/1995 | McKeown et al. |
| 5,405,235 A | 4/1995 | Lebre et al. |
| 5,434,420 A | 7/1995 | McKeown et al. |
| 5,440,133 A | 8/1995 | Moyers et al. |
| 5,451,794 A | 9/1995 | McKeown et al. |
| 5,461,773 A | 10/1995 | Kawaguchi |
| 5,463,291 A | 10/1995 | Carroll et al. |
| 5,464,411 A | 11/1995 | Schulte et al. |
| 5,492,922 A | 2/1996 | Palkowitz |
| 5,511,549 A | 4/1996 | Legg et al. |
| 5,521,469 A | 5/1996 | Laisne |
| 5,538,942 A | 7/1996 | Koyama et al. |
| 5,549,616 A | 8/1996 | Schulte et al. |
| 5,561,697 A | 10/1996 | Takafuji et al. |
| 5,585,642 A | 12/1996 | Britton et al. |
| 5,633,747 A | 5/1997 | Nikoonahad |
| 5,635,721 A | 6/1997 | Bardi et al. |
| 5,668,371 A | 9/1997 | Deasy et al. |
| 5,672,878 A | 9/1997 | Yao |
| 5,691,679 A | 11/1997 | Ackermann et al. |
| 5,726,448 A | 3/1998 | Smith et al. |
| 5,727,554 A | 3/1998 | Kalend et al. |
| 5,730,745 A | 3/1998 | Schulte et al. |
| 5,751,781 A | 5/1998 | Brown et al. |
| 5,778,047 A | 7/1998 | Mansfield et al. |
| 5,783,914 A | 7/1998 | Hiramoto et al. |
| 5,784,431 A | 7/1998 | Kalend et al. |
| 5,797,924 A | 8/1998 | Schulte et al. |
| 5,811,944 A | 9/1998 | Sampayan et al. |
| 5,818,058 A | 10/1998 | Nakanishi et al. |
| 5,821,705 A | 10/1998 | Caporaso et al. |
| 5,825,845 A | 10/1998 | Blair et al. |
| 5,841,237 A | 11/1998 | Alton |
| 5,846,043 A | 12/1998 | Spath |
| 5,851,182 A | 12/1998 | Sahadevan |
| 5,866,912 A | 2/1999 | Slater et al. |
| 5,874,811 A | 2/1999 | Finlan et al. |
| 5,895,926 A | 4/1999 | Britton et al. |
| 5,917,293 A | 6/1999 | Saito et al. |
| 5,920,601 A | 7/1999 | Nigg et al. |
| 5,929,458 A | 7/1999 | Nemezawa et al. |
| 5,963,615 A | 10/1999 | Egley et al. |
| 5,993,373 A | 11/1999 | Nonaka et al. |
| 6,008,499 A | 12/1999 | Hiramoto et al. |
| 6,034,377 A | 3/2000 | Pu |
| 6,057,655 A | 5/2000 | Jongen |
| 6,061,426 A | 5/2000 | Linders et al. |
| 6,064,807 A | 5/2000 | Arai et al. |
| 6,066,851 A | 5/2000 | Madono et al. |
| 6,080,992 A | 6/2000 | Nonaka et al. |
| 6,087,670 A | 7/2000 | Hiramoto et al. |
| 6,094,760 A | 8/2000 | Nonaka et al. |
| 6,118,848 A | 9/2000 | Reiffel |
| 6,140,021 A | 10/2000 | Nakasuji et al. |
| 6,144,875 A | 11/2000 | Sachweikard et al. |
| 6,158,708 A | 12/2000 | Egley et al. |
| 6,207,952 B1 | 3/2001 | Kan et al. |
| 6,219,403 B1 | 4/2001 | Nishihara |
| 6,222,905 B1 | 4/2001 | Yoda et al. |
| 6,241,671 B1 | 6/2001 | Ritter et al. |

(56) References Cited

U.S. PATENT DOCUMENTS

| | | | |
|---|---|---|---|
| 6,246,066 B1 | 6/2001 | Yuehu |
| 6,256,591 B1 | 7/2001 | Yoda et al. |
| 6,265,837 B1 | 7/2001 | Akiyama et al. |
| 6,268,610 B1 | 7/2001 | Pu |
| 6,278,239 B1 | 8/2001 | Caporaso et al. |
| 6,279,579 B1 | 8/2001 | Riaziat et al. |
| 6,307,914 B1 | 10/2001 | Kunieda et al. |
| 6,316,776 B1 | 11/2001 | Hiramoto et al. |
| 6,366,021 B1 | 4/2002 | Meddaugh et al. |
| 6,369,585 B2 | 4/2002 | Yao |
| 6,380,545 B1 | 4/2002 | Yan |
| 6,407,505 B1 | 6/2002 | Bertsche |
| 6,417,634 B1 * | 7/2002 | Bergstrom .................... 315/502 |
| 6,433,336 B1 | 8/2002 | Jongen et al. |
| 6,433,349 B2 | 8/2002 | Akiyama et al. |
| 6,433,494 B1 | 8/2002 | Kulish et al. |
| 6,441,569 B1 | 8/2002 | Janzow |
| 6,443,349 B1 | 9/2002 | Van Der Burg |
| 6,465,957 B1 | 10/2002 | Whitham et al. |
| 6,472,834 B2 | 10/2002 | Hiramoto et al. |
| 6,476,403 B1 | 11/2002 | Dolinskii et al. |
| 6,492,922 B1 | 12/2002 | New |
| 6,493,424 B2 | 12/2002 | Whitham |
| 6,498,444 B1 | 12/2002 | Hanna et al. |
| 6,501,981 B1 | 12/2002 | Schweikard et al. |
| 6,519,316 B1 | 2/2003 | Collins |
| 6,576,916 B2 | 6/2003 | Smith et al. |
| 6,593,696 B2 | 7/2003 | Ding et al. |
| 6,594,336 B2 | 7/2003 | Nishizawa et al. |
| 6,600,164 B1 | 7/2003 | Badura et al. |
| 6,617,598 B1 | 9/2003 | Matsuda |
| 6,621,889 B1 | 9/2003 | Mostafavi |
| 6,639,234 B1 | 10/2003 | Badura et al. |
| 6,646,383 B2 | 11/2003 | Bertsche et al. |
| 6,670,618 B1 | 12/2003 | Hartmann et al. |
| 6,683,318 B1 | 1/2004 | Haberer et al. |
| 6,683,426 B1 | 1/2004 | Kleeven |
| 6,693,283 B2 | 2/2004 | Eickhoff et al. |
| 6,710,362 B2 | 3/2004 | Kraft et al. |
| 6,713,773 B1 | 3/2004 | Lyons et al. |
| 6,713,976 B1 | 3/2004 | Zumoto et al. |
| 6,717,162 B1 | 4/2004 | Jongen |
| 6,736,831 B1 | 5/2004 | Hartmann et al. |
| 6,745,072 B1 | 6/2004 | Badura et al. |
| 6,769,806 B2 | 8/2004 | Moyers |
| 6,774,383 B2 | 8/2004 | Norimine et al. |
| 6,777,689 B2 | 8/2004 | Nelson |
| 6,777,700 B2 | 8/2004 | Yanagisawa et al. |
| 6,780,149 B1 | 8/2004 | Schulte |
| 6,799,068 B1 | 9/2004 | Hartmann et al. |
| 6,800,866 B2 | 10/2004 | Amemiya et al. |
| 6,803,591 B2 | 10/2004 | Muramatsu et al. |
| 6,814,694 B1 | 11/2004 | Pedroni |
| 6,822,244 B2 | 11/2004 | Beloussov et al. |
| 6,853,703 B2 | 2/2005 | Svatos et al. |
| 6,864,770 B2 | 3/2005 | Nemoto et al. |
| 6,865,254 B2 | 3/2005 | Nafstadius |
| 6,873,123 B2 | 3/2005 | Marchand et al. |
| 6,891,177 B1 | 5/2005 | Kraft et al. |
| 6,891,924 B1 | 5/2005 | Yoda et al. |
| 6,894,300 B2 | 5/2005 | Reimoser et al. |
| 6,897,451 B2 | 5/2005 | Kaercher et al. |
| 6,914,396 B1 | 7/2005 | Symons et al. |
| 6,936,832 B2 | 8/2005 | Norimine et al. |
| 6,953,943 B2 | 10/2005 | Yanagisawa et al. |
| 6,965,116 B1 | 11/2005 | Wagner et al. |
| 6,969,194 B1 | 11/2005 | Nafstadius |
| 6,979,832 B2 | 12/2005 | Yanagisawa et al. |
| 6,984,835 B2 | 1/2006 | Harada |
| 6,992,312 B2 | 1/2006 | Yanagisawa et al. |
| 6,993,112 B2 | 1/2006 | Hesse |
| 7,008,105 B2 | 3/2006 | Amann et al. |
| 7,011,447 B2 | 3/2006 | Moyers |
| 7,012,267 B2 | 3/2006 | Moriyama et al. |
| 7,014,361 B1 | 3/2006 | Ein-Gal |
| 7,026,636 B2 | 4/2006 | Yanagisawa et al. |
| 7,038,403 B2 | 5/2006 | Mastrangeli et al. |
| 7,041,479 B2 | 5/2006 | Swartz et al. |
| 7,045,781 B2 | 5/2006 | Adamec et al. |
| 7,049,613 B2 | 5/2006 | Yanagisawa et al. |
| 7,053,389 B2 | 5/2006 | Yanagisawa et al. |
| 7,054,801 B2 | 5/2006 | Sakamoto et al. |
| 7,060,997 B2 | 6/2006 | Norimine et al. |
| 7,071,479 B2 | 7/2006 | Yanagisawa et al. |
| 7,073,508 B2 | 7/2006 | Moyers |
| 7,081,619 B2 | 7/2006 | Bashkirov et al. |
| 7,084,410 B2 | 8/2006 | Beloussov et al. |
| 7,091,478 B2 | 8/2006 | Haberer |
| 7,102,144 B2 | 9/2006 | Matsuda et al. |
| 7,122,811 B2 | 10/2006 | Matsuda et al. |
| 7,122,966 B2 | 10/2006 | Norling et al. |
| 7,122,978 B2 | 10/2006 | Nakanishi et al. |
| 7,135,678 B2 | 11/2006 | Wang et al. |
| 7,138,771 B2 | 11/2006 | Bechthold et al. |
| 7,154,107 B2 | 12/2006 | Yanagisawa et al. |
| 7,154,108 B2 | 12/2006 | Tadokoro et al. |
| 7,154,991 B2 | 12/2006 | Earnst et al. |
| 7,162,005 B2 | 1/2007 | Bjorkholm |
| 7,173,264 B2 | 2/2007 | Moriyama et al. |
| 7,173,265 B2 | 2/2007 | Miller et al. |
| 7,173,385 B2 | 2/2007 | Caporaso et al. |
| 7,186,991 B2 | 3/2007 | Kato et al. |
| 7,193,227 B2 | 3/2007 | Hiramoto et al. |
| 7,199,382 B2 | 4/2007 | Rigney et al. |
| 7,208,748 B2 | 4/2007 | Sliski et al. |
| 7,212,608 B2 | 5/2007 | Nagamine et al. |
| 7,212,609 B2 | 5/2007 | Nagamine et al. |
| 7,221,733 B1 | 5/2007 | Takai et al. |
| 7,227,161 B2 | 6/2007 | Matsuda et al. |
| 7,247,869 B2 | 7/2007 | Tadokoro et al. |
| 7,257,191 B2 | 8/2007 | Sommer |
| 7,259,529 B2 | 8/2007 | Tanaka |
| 7,262,424 B2 | 8/2007 | Moriyama et al. |
| 7,262,565 B2 | 8/2007 | Fujisawa |
| 7,274,018 B2 | 9/2007 | Adamec et al. |
| 7,280,633 B2 | 10/2007 | Cheng et al. |
| 7,295,649 B2 | 11/2007 | Johnsen |
| 7,297,967 B2 | 11/2007 | Yanagisawa et al. |
| 7,301,162 B2 | 11/2007 | Matsuda et al. |
| 7,307,264 B2 | 12/2007 | Brusasco et al. |
| 7,318,805 B2 | 1/2008 | Schweikard et al. |
| 7,319,231 B2 | 1/2008 | Moriyama et al. |
| 7,319,336 B2 | 1/2008 | Baur et al. |
| 7,331,713 B2 | 2/2008 | Moyers |
| 7,332,880 B2 | 2/2008 | Ina et al. |
| 7,345,291 B2 | 3/2008 | Kats |
| 7,345,292 B2 | 3/2008 | Moriyama et al. |
| 7,348,557 B2 | 3/2008 | Armit |
| 7,348,579 B2 | 3/2008 | Pedroni |
| 7,351,988 B2 | 4/2008 | Naumann et al. |
| 7,355,189 B2 | 4/2008 | Yanagisawa et al. |
| 7,368,740 B2 | 5/2008 | Beloussov et al. |
| 7,372,053 B2 | 5/2008 | Yamashita et al. |
| 7,378,672 B2 | 5/2008 | Harada |
| 7,381,979 B2 | 6/2008 | Yamashita et al. |
| 7,397,054 B2 | 7/2008 | Natori et al. |
| 7,397,901 B1 | 7/2008 | Johnsen |
| 7,398,309 B2 | 7/2008 | Baumann et al. |
| 7,402,822 B2 | 7/2008 | Guertin et al. |
| 7,402,823 B2 | 7/2008 | Guertin et al. |
| 7,402,824 B2 | 7/2008 | Guertin et al. |
| 7,402,963 B2 | 7/2008 | Sliski |
| 7,405,407 B2 | 7/2008 | Hiramoto et al. |
| 7,425,717 B2 | 9/2008 | Matsuda et al. |
| 7,432,516 B2 | 10/2008 | Peggs et al. |
| 7,439,528 B2 | 10/2008 | Nishiuchi et al. |
| 7,446,328 B2 | 11/2008 | Rigney et al. |
| 7,446,490 B2 | 11/2008 | Jongen et al. |
| 7,449,701 B2 | 11/2008 | Fujimaki et al. |
| 7,453,076 B2 | 11/2008 | Welch et al. |
| 7,465,944 B2 | 12/2008 | Ueno et al. |
| 7,466,085 B2 | 12/2008 | Nutt |
| 7,468,506 B2 | 12/2008 | Rogers et al. |
| 7,473,913 B2 | 1/2009 | Hermann et al. |

(56) References Cited

U.S. PATENT DOCUMENTS

| | | |
|---|---|---|
| 7,476,867 B2 | 1/2009 | Fritsch et al. |
| 7,476,883 B2 | 1/2009 | Nutt |
| 7,482,606 B2 | 1/2009 | Groezinger et al. |
| 7,492,556 B2 | 2/2009 | Atkins et al. |
| 7,507,975 B2 | 3/2009 | Mohr |
| 7,525,104 B2 | 4/2009 | Harada |
| 7,541,905 B2 | 6/2009 | Antaya |
| 7,547,901 B2 | 6/2009 | Guertin et al. |
| 7,554,096 B2 | 6/2009 | Ward et al. |
| 7,554,097 B2 | 6/2009 | Ward et al. |
| 7,555,103 B2 | 6/2009 | Johnsen |
| 7,557,358 B2 | 7/2009 | Ward et al. |
| 7,557,359 B2 | 7/2009 | Ward et al. |
| 7,557,360 B2 | 7/2009 | Ward et al. |
| 7,557,361 B2 | 7/2009 | Ward et al. |
| 7,560,715 B2 | 7/2009 | Pedroni |
| 7,560,717 B2 | 7/2009 | Matsuda et al. |
| 7,567,694 B2 | 7/2009 | Lu et al. |
| 7,574,251 B2 | 8/2009 | Lu et al. |
| 7,576,499 B2 | 8/2009 | Caporaso et al. |
| 7,579,603 B2 | 8/2009 | Birgy et al. |
| 7,579,610 B2 | 8/2009 | Grozinger et al. |
| 7,582,866 B2 | 9/2009 | Furuhashi et al. |
| 7,582,885 B2 | 9/2009 | Katagiri et al. |
| 7,582,886 B2 | 9/2009 | Trbojevic |
| 7,586,112 B2 | 9/2009 | Chiba et al. |
| 7,598,497 B2 | 10/2009 | Yamamoto et al. |
| 7,609,009 B2 | 10/2009 | Tanaka et al. |
| 7,609,809 B2 | 10/2009 | Kapatoes et al. |
| 7,609,811 B1 | 10/2009 | Siljamaki et al. |
| 7,615,942 B2 | 11/2009 | Sanders et al. |
| 7,626,347 B2 | 12/2009 | Sliski et al. |
| 7,629,598 B2 | 12/2009 | Harada |
| 7,639,853 B2 | 12/2009 | Olivera et al. |
| 7,639,854 B2 | 12/2009 | Schnarr et al. |
| 7,643,661 B2 | 1/2010 | Ruchala et al. |
| 7,656,258 B1 | 2/2010 | Antaya et al. |
| 7,659,521 B2 | 2/2010 | Pedroni |
| 7,659,528 B2 | 2/2010 | Uematsu |
| 7,668,291 B2 | 2/2010 | Nord et al. |
| 7,672,429 B2 | 3/2010 | Urano et al. |
| 7,679,073 B2 | 3/2010 | Urano et al. |
| 7,682,078 B2 | 3/2010 | Rietzel |
| 7,692,166 B2 | 4/2010 | Muraki et al. |
| 7,692,168 B2 | 4/2010 | Moriyama et al. |
| 7,696,499 B2 | 4/2010 | Miller et al. |
| 7,696,847 B2 | 4/2010 | Antaya |
| 7,701,677 B2 | 4/2010 | Schultz et al. |
| 7,709,818 B2 | 5/2010 | Matsuda et al. |
| 7,710,051 B2 | 5/2010 | Caporaso et al. |
| 7,728,311 B2 | 6/2010 | Gall |
| 7,746,978 B2 | 6/2010 | Cheng et al. |
| 7,755,305 B2 | 7/2010 | Umezawa et al. |
| 7,759,642 B2 | 7/2010 | Nir |
| 7,763,867 B2 | 7/2010 | Birgy et al. |
| 7,767,988 B2 | 8/2010 | Kaiser et al. |
| 7,770,231 B2 | 8/2010 | Prater et al. |
| 7,772,577 B2 | 8/2010 | Saito et al. |
| 7,773,723 B2 | 8/2010 | Nord et al. |
| 7,773,788 B2 | 8/2010 | Lu et al. |
| 7,778,488 B2 | 8/2010 | Nord et al. |
| 7,783,010 B2 | 8/2010 | Clayton |
| 7,784,127 B2 | 8/2010 | Kuro et al. |
| 7,786,451 B2 | 8/2010 | Ward et al. |
| 7,786,452 B2 | 8/2010 | Ward et al. |
| 7,789,560 B2 | 9/2010 | Moyers |
| 7,791,051 B2 | 9/2010 | Beloussov et al. |
| 7,796,731 B2 | 9/2010 | Nord et al. |
| 7,801,269 B2 | 9/2010 | Cravens et al. |
| 7,801,270 B2 | 9/2010 | Nord et al. |
| 7,801,988 B2 | 9/2010 | Baumann et al. |
| 7,807,982 B2 | 10/2010 | Nishiuchi et al. |
| 7,809,107 B2 | 10/2010 | Nord et al. |
| 7,812,319 B2 | 10/2010 | Diehl et al. |
| 7,812,326 B2 | 10/2010 | Grozinger et al. |
| 7,816,657 B2 | 10/2010 | Hansmann et al. |
| 7,817,778 B2 | 10/2010 | Nord et al. |
| 7,817,836 B2 | 10/2010 | Chao et al. |
| 7,834,334 B2 | 11/2010 | Grozinger et al. |
| 7,834,336 B2 | 11/2010 | Boeh et al. |
| 7,835,494 B2 | 11/2010 | Nord et al. |
| 7,835,502 B2 | 11/2010 | Spence et al. |
| 7,839,972 B2 | 11/2010 | Ruchala et al. |
| 7,839,973 B2 | 11/2010 | Nord et al. |
| 7,848,488 B2 | 12/2010 | Mansfield |
| 7,857,756 B2 | 12/2010 | Warren et al. |
| 7,860,216 B2 | 12/2010 | Jongen et al. |
| 7,860,550 B2 | 12/2010 | Saracen et al. |
| 7,868,301 B2 | 1/2011 | Diehl |
| 7,875,861 B2 | 1/2011 | Huttenberger et al. |
| 7,875,868 B2 | 1/2011 | Moriyama et al. |
| 7,881,431 B2 | 2/2011 | Aoi et al. |
| 7,894,574 B1 | 2/2011 | Nord et al. |
| 7,906,769 B2 | 3/2011 | Blasche et al. |
| 7,914,734 B2 | 3/2011 | Livingston |
| 7,919,765 B2 | 4/2011 | Timmer |
| 7,920,040 B2 | 4/2011 | Antaya et al. |
| 7,920,675 B2 | 4/2011 | Lomax et al. |
| 7,928,415 B2 | 4/2011 | Bert et al. |
| 7,934,869 B2 | 5/2011 | Ivanov et al. |
| 7,940,881 B2 | 5/2011 | Jongen et al. |
| 7,943,913 B2 | 5/2011 | Balakin |
| 7,947,969 B2 | 5/2011 | Pu |
| 7,949,096 B2 | 5/2011 | Cheng et al. |
| 7,950,587 B2 | 5/2011 | Henson et al. |
| 7,960,710 B2 | 6/2011 | Kruip et al. |
| 7,961,844 B2 | 6/2011 | Takeda et al. |
| 7,977,648 B2 | 7/2011 | Westerly et al. |
| 7,977,656 B2 | 7/2011 | Fujimaki et al. |
| 7,982,198 B2 | 7/2011 | Nishiuchi et al. |
| 7,982,416 B2 | 7/2011 | Tanaka et al. |
| 7,984,715 B2 | 7/2011 | Moyers |
| 7,986,768 B2 | 7/2011 | Nord et al. |
| 7,987,053 B2 | 7/2011 | Schaffner |
| 7,989,785 B2 | 8/2011 | Emhofer et al. |
| 7,990,524 B2 | 8/2011 | Jureller et al. |
| 7,997,553 B2 | 8/2011 | Sloan et al. |
| 8,002,466 B2 | 8/2011 | Von Neubeck et al. |
| 8,003,964 B2 | 8/2011 | Stark et al. |
| 8,009,803 B2 | 8/2011 | Nord et al. |
| 8,009,804 B2 | 8/2011 | Siljamaki et al. |
| 8,039,822 B2 | 10/2011 | Rietzel |
| 8,041,006 B2 | 10/2011 | Boyden et al. |
| 8,044,364 B2 | 10/2011 | Yamamoto |
| 8,049,187 B2 | 11/2011 | Tachikawa |
| 8,053,508 B2 | 11/2011 | Korkut et al. |
| 8,053,739 B2 | 11/2011 | Rietzel |
| 8,053,745 B2 | 11/2011 | Moore |
| 8,053,746 B2 | 11/2011 | Timmer et al. |
| 8,067,748 B2 | 11/2011 | Balakin |
| 8,069,675 B2 | 12/2011 | Radovinsky et al. |
| 8,071,966 B2 | 12/2011 | Kaiser et al. |
| 8,080,801 B2 | 12/2011 | Safai |
| 8,085,899 B2 | 12/2011 | Nord et al. |
| 8,089,054 B2 | 1/2012 | Balakin |
| 8,093,564 B2 | 1/2012 | Balakin |
| 8,093,568 B2 | 1/2012 | Mackie et al. |
| 8,111,125 B2 | 2/2012 | Antaya et al. |
| 8,129,699 B2 | 3/2012 | Balakin |
| 8,144,832 B2 | 3/2012 | Balakin |
| 8,173,981 B2 | 5/2012 | Trbojevic |
| 8,188,688 B2 | 5/2012 | Balakin |
| 8,198,607 B2 | 6/2012 | Balakin |
| 8,222,613 B2 | 7/2012 | Tajiri et al. |
| 8,227,768 B2 | 7/2012 | Smick et al. |
| 8,232,536 B2 | 7/2012 | Harada |
| 8,288,742 B2 | 10/2012 | Balakin |
| 8,291,717 B2 | 10/2012 | Radovinsky et al. |
| 8,294,127 B2 | 10/2012 | Tachibana |
| 8,304,725 B2 | 11/2012 | Komuro et al. |
| 8,304,750 B2 | 11/2012 | Preikszas et al. |
| 8,309,941 B2 | 11/2012 | Balakin |
| 8,330,132 B2 | 12/2012 | Guertin et al. |
| 8,334,520 B2 | 12/2012 | Otaka et al. |

(56) References Cited

U.S. PATENT DOCUMENTS

| | | |
|---|---|---|
| 8,335,397 B2 | 12/2012 | Takane et al. |
| 8,344,340 B2 | 1/2013 | Gall et al. |
| 8,350,214 B2 | 1/2013 | Otaki et al. |
| 8,368,038 B2 | 2/2013 | Balakin |
| 8,368,043 B2 | 2/2013 | Havelange et al. |
| 8,373,143 B2 | 2/2013 | Balakin |
| 8,373,145 B2 | 2/2013 | Balakin |
| 8,378,299 B2 | 2/2013 | Frosien |
| 8,378,321 B2 | 2/2013 | Balakin |
| 8,382,943 B2 | 2/2013 | Clark |
| 8,389,949 B2 | 3/2013 | Harada et al. |
| 8,399,866 B2 | 3/2013 | Balakin |
| 8,405,042 B2 | 3/2013 | Honda et al. |
| 8,405,056 B2 | 3/2013 | Amaldi et al. |
| 8,415,643 B2 | 4/2013 | Balakin |
| 8,416,918 B2 | 4/2013 | Nord et al. |
| 8,421,041 B2 | 4/2013 | Balakin |
| 8,426,833 B2 | 4/2013 | Trbojevic |
| 8,436,323 B2 | 5/2013 | Iseki et al. |
| 8,440,987 B2 | 5/2013 | Stephani et al. |
| 8,445,872 B2 | 5/2013 | Behrens et al. |
| 8,466,441 B2 | 6/2013 | Iwata et al. |
| 8,472,583 B2 | 6/2013 | Star-Lack et al. |
| 8,483,357 B2 | 7/2013 | Siljamaki et al. |
| 8,487,278 B2 | 7/2013 | Balakin |
| 8,552,406 B2 | 10/2013 | Phaneuf et al. |
| 8,552,408 B2 | 10/2013 | Hanawa et al. |
| 8,569,717 B2 | 10/2013 | Balakin |
| 8,581,215 B2 | 11/2013 | Balakin |
| 8,653,314 B2 | 2/2014 | Pelati et al. |
| 8,653,473 B2 | 2/2014 | Yajima |
| 2002/0172317 A1 | 11/2002 | Maksimchuk et al. |
| 2003/0048080 A1 | 3/2003 | Amemiya et al. |
| 2003/0125622 A1 | 7/2003 | Schweikard et al. |
| 2003/0136924 A1 | 7/2003 | Kraft et al. |
| 2003/0152197 A1 | 8/2003 | Moyers |
| 2003/0163015 A1 | 8/2003 | Yanagisawa et al. |
| 2003/0183779 A1 | 10/2003 | Norimine et al. |
| 2003/0234369 A1 | 12/2003 | Glukhoy |
| 2004/0000650 A1 | 1/2004 | Yanagisawa et al. |
| 2004/0017888 A1 | 1/2004 | Seppi et al. |
| 2004/0056212 A1 | 3/2004 | Yanagisawa et al. |
| 2004/0061077 A1 | 4/2004 | Muramatsu et al. |
| 2004/0061078 A1 | 4/2004 | Muramatsu et al. |
| 2004/0085023 A1 | 5/2004 | Chistakov |
| 2004/0098445 A1 | 5/2004 | Baumann et al. |
| 2004/0111134 A1 | 6/2004 | Muramatsu et al. |
| 2004/0118081 A1 | 6/2004 | Reimoser et al. |
| 2004/0149934 A1 | 8/2004 | Yanagisawa et al. |
| 2004/0159795 A1 | 8/2004 | Kaercher et al. |
| 2004/0173763 A1 | 9/2004 | Moriyama et al. |
| 2004/0174958 A1 | 9/2004 | Moriyama et al. |
| 2004/0183033 A1 | 9/2004 | Moriyama et al. |
| 2004/0183035 A1 | 9/2004 | Yanagisawa et al. |
| 2004/0200982 A1 | 10/2004 | Moriyama et al. |
| 2004/0200983 A1 | 10/2004 | Fujimaki et al. |
| 2004/0213381 A1 | 10/2004 | Harada |
| 2004/0227104 A1 | 11/2004 | Matsuda et al. |
| 2004/0232356 A1 | 11/2004 | Norimine et al. |
| 2004/0240626 A1 | 12/2004 | Moyers |
| 2005/0058245 A1 | 3/2005 | Ein-Gal |
| 2005/0089141 A1 | 4/2005 | Brown |
| 2005/0161618 A1 | 7/2005 | Pedroni |
| 2005/0184686 A1 | 8/2005 | Caporaso et al. |
| 2005/0228255 A1 | 10/2005 | Saracen et al. |
| 2005/0234327 A1 | 10/2005 | Saracen et al. |
| 2005/0247890 A1 | 11/2005 | Norimine et al. |
| 2006/0017015 A1 | 1/2006 | Sliski et al. |
| 2006/0067468 A1 | 3/2006 | Rietzel |
| 2006/0126792 A1 | 6/2006 | Li |
| 2006/0145088 A1 | 7/2006 | Ma |
| 2006/0284562 A1 | 12/2006 | Hruby et al. |
| 2007/0001128 A1 | 1/2007 | Sliski et al. |
| 2007/0013273 A1 | 1/2007 | Albert et al. |
| 2007/0014654 A1 | 1/2007 | Haverfield et al. |
| 2007/0023699 A1 | 2/2007 | Yamashita et al. |
| 2007/0029510 A1 | 2/2007 | Hermann et al. |
| 2007/0051904 A1 | 3/2007 | Kaiser et al. |
| 2007/0092812 A1 | 4/2007 | Caporaso et al. |
| 2007/0114945 A1 | 5/2007 | Mattaboni et al. |
| 2007/0145916 A1 | 6/2007 | Caporaso et al. |
| 2007/0171015 A1 | 7/2007 | Antaya |
| 2007/0181519 A1 | 8/2007 | Khoshnevis |
| 2007/0284548 A1 | 12/2007 | Kaiser et al. |
| 2008/0093567 A1 | 4/2008 | Gall |
| 2008/0218102 A1 | 9/2008 | Sliski |
| 2009/0096179 A1 | 4/2009 | Stark et al. |
| 2009/0140671 A1 | 6/2009 | O'Neal, III et al. |
| 2009/0140672 A1 | 6/2009 | Gall et al. |
| 2009/0200483 A1 | 8/2009 | Gall et al. |
| 2010/0045213 A1 | 2/2010 | Sliski et al. |
| 2013/0237425 A1 | 9/2013 | Leigh et al. |
| 2014/0097920 A1 | 4/2014 | Goldie et al. |

FOREIGN PATENT DOCUMENTS

| | | |
|---|---|---|
| CN | 1537657 | 10/2004 |
| CN | 1537657 A | 10/2004 |
| CN | 1377521 | 10/2008 |
| CN | 101932361 | 12/2010 |
| CN | 101933405 | 12/2010 |
| CN | 101933406 | 12/2010 |
| CN | 102036461 | 4/2011 |
| CN | 101061759 | 5/2011 |
| CN | ZL 200580024522.4 | 5/2011 |
| CN | ZL 201010581384.2 | 11/2012 |
| DE | 27 53 397 | 6/1978 |
| DE | 31 48 100 | 6/1983 |
| DE | 35 30 446 | 8/1984 |
| DE | 41 01 094 C1 | 5/1992 |
| DE | 4411171 | 10/1995 |
| EP | 0044153 | 1/1982 |
| EP | 0194728 | 9/1986 |
| EP | 0 277 521 | 8/1988 |
| EP | 0 208 163 B1 | 1/1989 |
| EP | 0 222 786 | 7/1990 |
| EP | 0 221 987 | 1/1991 |
| EP | 0499253 | 8/1992 |
| EP | 0 306 966 | 4/1995 |
| EP | 0 388 123 | 5/1995 |
| EP | 0 465 597 | 5/1997 |
| EP | 0 864 337 | 9/1998 |
| EP | 0 776 595 | 12/1998 |
| EP | 1 069 809 | 1/2001 |
| EP | 1 153 398 A1 | 4/2001 |
| EP | 1 294 445 | 3/2003 |
| EP | 1 348 465 | 10/2003 |
| EP | 1 358 908 | 11/2003 |
| EP | 1 371 390 | 12/2003 |
| EP | 1 402 923 | 3/2004 |
| EP | 0 911 064 | 6/2004 |
| EP | 1 430 932 | 6/2004 |
| EP | 1430932 | 6/2004 |
| EP | 1 454 653 | 9/2004 |
| EP | 1 454 654 | 9/2004 |
| EP | 1 454 655 A2 | 9/2004 |
| EP | 1 454 656 | 9/2004 |
| EP | 1 454 657 | 9/2004 |
| EP | 1 477 206 | 11/2004 |
| EP | 1 605 742 A1 | 12/2005 |
| EP | 1 738 798 | 1/2007 |
| EP | 1790203 | 5/2007 |
| EP | 1826778 | 8/2007 |
| EP | 1949404 | 7/2008 |
| EP | 2183753 | 7/2008 |
| EP | 2394498 | 2/2010 |
| EP | 2227295 | 9/2010 |
| EP | 2232961 | 9/2010 |
| EP | 2232962 | 9/2010 |
| EP | 2259664 | 12/2010 |
| EP | 2227295 | 5/2011 |
| EP | 2363170 | 9/2011 |
| EP | 2363171 | 9/2011 |
| FR | 2 560 421 | 8/1985 |

(56) References Cited

FOREIGN PATENT DOCUMENTS

| | | |
|---|---|---|
| FR | 2911843 | 8/2008 |
| GB | 957342 | 5/1964 |
| GB | 2015821 A | 9/1979 |
| GB | 2 361 523 | 10/2001 |
| JP | 43-23267 | 10/1968 |
| JP | U-48-108098 | 12/1973 |
| JP | 57-162527 | 10/1982 |
| JP | 58-141000 | 8/1983 |
| JP | 61-80800 | 4/1986 |
| JP | 61-225798 | 10/1986 |
| JP | 62-150804 | 7/1987 |
| JP | 62-186500 | 8/1987 |
| JP | 63-149344 | 6/1988 |
| JP | 63-218200 | 9/1988 |
| JP | 63-226899 | 9/1988 |
| JP | 64-89621 | 4/1989 |
| JP | 1-276797 | 11/1989 |
| JP | 01-302700 | 12/1989 |
| JP | 4-94198 | 3/1992 |
| JP | 04-128717 | 4/1992 |
| JP | 04-129768 | 4/1992 |
| JP | 04-273409 | 9/1992 |
| JP | 04-337300 | 11/1992 |
| JP | 05-341352 | 12/1993 |
| JP | 5046928 | 12/1993 |
| JP | 06233831 | 8/1994 |
| JP | 06233831 A | 8/1994 |
| JP | 06-036893 | 10/1994 |
| JP | 07-263196 | 10/1995 |
| JP | 2007-260939 A | 10/1995 |
| JP | 07260939 | 10/1995 |
| JP | 08-173890 | 7/1996 |
| JP | 08-264298 | 10/1996 |
| JP | 09-162585 | 6/1997 |
| JP | 10-071213 | 3/1998 |
| JP | 11-47287 | 2/1999 |
| JP | 11-102800 | 4/1999 |
| JP | 11-243295 | 9/1999 |
| JP | 2000-294399 | 10/2000 |
| JP | 2001-6900 | 1/2001 |
| JP | 2001-0090580 | 1/2001 |
| JP | 2001-129103 | 5/2001 |
| JP | 2001-346893 | 12/2001 |
| JP | 2002-164686 | 6/2002 |
| JP | 2003-517755 | 5/2003 |
| JP | 2005-526578 | 9/2005 |
| JP | 2008-507826 | 3/2008 |
| JP | 2009-515671 | 4/2009 |
| JP | 2009-516905 | 4/2009 |
| JP | 2011-505191 | 2/2011 |
| JP | 2011-505670 | 2/2011 |
| JP | 2011-507151 | 3/2011 |
| JP | 5436443 | 12/2013 |
| JP | 5736443 | 12/2013 |
| RU | SU 300137 | 11/1969 |
| RU | SU 569 635 | 8/1977 |
| TW | 200930160 | 7/2009 |
| TW | 200934682 | 8/2009 |
| TW | 200939908 | 9/2009 |
| TW | 200940120 | 10/2009 |
| WO | WO 86/07229 | 12/1986 |
| WO | WO90/12413 | 10/1990 |
| WO | WO 92/03028 | 2/1992 |
| WO | WO 93/02536 | 2/1993 |
| WO | WO 98/17342 | 4/1998 |
| WO | WO99/39385 | 5/1999 |
| WO | WO 00/40064 | 7/2000 |
| WO | WO 00/49624 | 8/2000 |
| WO | 01/26230 | 4/2001 |
| WO | WO 01/26569 | 4/2001 |
| WO | WO 02/07817 | 1/2002 |
| WO | WO 03/039212 | 5/2003 |
| WO | WO 03/092812 | 11/2003 |
| WO | WO 2004/026401 | 4/2004 |
| WO | WO 2004/101070 | 11/2004 |
| WO | 2006-012467 | 2/2006 |
| WO | 2007/061937 | 5/2007 |
| WO | WO2007/061937 | 5/2007 |
| WO | WO2007/084701 | 7/2007 |
| WO | WO2007/130164 | 11/2007 |
| WO | WO2007/145906 | 12/2007 |
| WO | WO2008/030911 | 3/2008 |
| WO | 2008/081480 | 7/2008 |
| WO | WO 2009/048745 | 4/2009 |
| WO | WO 2009/070173 | 6/2009 |
| WO | WO2009-070173 | 6/2009 |
| WO | WO2009-070588 | 6/2009 |
| WO | WO2009-073480 | 6/2009 |
| WO | WO 2009/048745 | 11/2009 |

OTHER PUBLICATIONS

International Search Report and Written Opinion of the International Searching Authority from International application No. PCT/US2008/084699, mailed Feb. 4, 2009, 11 pages.
Office action and response history of U.S. Appl. No. 11/601,056, to Mar. 24, 2009.
U.S. Appl. No. 60/738,404, filed Nov. 18, 2005, including application as filed.
PCT application No. PCT/US2006/44853, filed on Nov. 17, 2006, with Publication No. WO/2007/061937, including application as filed.
U.S. Appl. No. 10/949,734, filed Sep. 24, 2004, Patent No. 7,208,748, issued on Apr. 24, 2007, including application as filed, and allowed claims.
U.S. Appl. No. 11/724,055, filed Mar. 14, 2007, including application as filed (including pending claims).
U.S. Appl. No. 11/371,622, filed Mar. 9, 2006, including application as filed, and pending claims.
U.S. Appl. No. 60/590,088, filed Jul. 21, 2004, including application as filed.
U.S. Appl. No. 11/948,662, filed Nov. 30, 2007, including application as filed, and pending claims.
U.S. Appl. No. 11/187,633, filed Jul. 21, 2005, including application as filed, and pending claims.
PCT application No. PCT/US2005/25942 filed on Jul. 21, 2005, with Publication No. WO/2006/012452, including application as filed.
U.S. Appl. No. 11/463,403, filed Aug. 9, 20006, including application as filed (including pending claims).
U.S. Appl. No. 11/517,490, filed Sep. 7, 2006, including application as filed (including pending claims).
U.S. Appl. No. 11/624,769, filed Jan. 19, 2007, including application as filed (including pending claims).
PCT application No. PCT/US2007/01506 filed on Jan. 19, 2007, with Publication No. WO/2007/084701, including application as filed.
PCT application No. PCT/US2007/01628 filed on Jan. 19, 2007, with Publication No. WO/2007/130164, including application as filed.
PCT application No. PCT/US2007/77693 filed on Sep. 6, 2007with Publication No. WO/2007/77693, including application as filed.
U.S. Appl. No. 11/870,961, filed Oct. 11, 2007, including application as filed (including pending claims).
PCT application No. PCT/US2008/077513, filed on Sep. 24, 2008, including application as filed.
PCT application No. PCT/US2008/084695 filed on Nov. 25, 2008, including application as filed.
U.S. Appl. No. 60/991,454, filed Nov. 30, 2007, including application as filed.
U.S. Appl. No. 12/275,103, filed Nov. 20, 2008, including application as filed (including pending claims).
PCT application No. PCT/US2007/086109 filed on Nov. 30, 2007, including application as filed.
U.S. Appl. No. 60/850,565, filed Oct. 10, 2006, including application as filed.
PCT International Search report and Written Opinion of PCT application No. PCT/US2006/044853, mailed Oct. 5, 2007 (12 pages).
PCT International Preliminary Report on Patentability of corresponding PCT application No. PCT/US2006/044853, mailed May 29, 2008 (8 pages).

(56) References Cited

OTHER PUBLICATIONS

International Search Report dated Aug. 26, 2008 in PCT application No. PCT/US2007/086109 (6 pages).
Written Opinion dated Aug. 26, 2008 in PCT application No. PCT/US2007/086109 (6 pages).
International Search Report and Written Opinion for PCT application No. PCT/US2008/084695 mailed Jan. 26, 2009 (15 pages).
International Search Report and Written Opinion for PCT application No. PCT/US2007/001506 mailed Jul. 5, 2007, Publication No. WO2007/084701, Published Jul. 26, 2007 (14 pages).
International Preliminary Report on Patentability for PCT application No. PCT/US2007/001506 mailed Jul. 5, 2007 (15 pages).
International Search Report for PCT/US2007/001628 mailed Feb. 18, 2008 (4 pages).
Written Opinion for PCT/US2007/001628, mailed Feb. 18, 2008 (11 pages).
International Preliminary Report on Patentability for PCT/US2007/001628, mailed Apr. 22, 2008 (15 pages).
Abrosimov, N.K., et al. Proc. Academy Science, USSR 5, 84 (1985).
Abrosimov, N. K., et al, "1000MeV Proton Beam Therapy facility at Petersburg Nuclear Physics Institute Synchrocyclotron", Medical Radiology (Moscow) 32, 10 (1987) revised in Journal of Physics, Conference Series 41, pp. 424-432, Institute of Physics Publishing Limited, 2006.
Adachi, T., et. al. "A 150MeV FFAG Synchrotron with "Return-Yoke Free" Magent" *Proceedings of the 2001 Particle Accelerator Conference*, Chicago (2001).
Ageyev, A. I., et. al. "The IHEP Accelerating and Storage Complex (UNK) Status Report" *11th International Conference on High-Energy Accelerators*, pp. 60-70 (Jul. 7-11, 1980).
Agosteo, S., et. al. "Maze Design of a gantry room for proton therapy" *Nuclear Instruments & Methods In Physics Research*, Section A, 382, pp. 573-582 (1996).
Allardyce, B. W., et al., "Performance and Prospects of the Reconstructed CERN 600 MeV Synchrocyclotron" IEEE Transactions on Nuclear Science USA ns-24:(3), pp. 1631-1633 (Jun. 1977).
Alexeev, V. P., et. al. "R4 Design of Superconducting Magents for Proton Synchrotrons" *Proceedings of the Fifth International Cryogenic Engineering Conference*, pp. 531-533 (1974).
Amaldi, U. "Overview of the world landscape of Hadrontherapy and the projects of the TERA foundation" *Physica Medica, An International journal Devoted to the Applications of Physics to Medicine and Biology*, vol. XIV, Supplement 1 (Jul. 1998), *6th Workshop on Heavy Charged Particles in Biology and Medicine*, Instituto Scientific Europeo (ISE), Baveno, pp. 76-85 (Sep. 29-Oct. 1, 1997).
Amaldi, U., et. al. "The Italian project for a hadrontherapy centre" *Nuclear Instruments and Methods in Physics Research A*, 360, pp. 297-301 (1995).
"An Accelerated Collaboration Meets with Beaming Success", Lawrence Livermore National Laboratory, Apr. 12, 2006, S&TR,,Livermore, California, pp. 1-3. http://www.llnl.gov/str/April06/Caporaso.html.
Anferov, V., et al. "The Indiana University Midwest Proton Radiation Institute" *Proceedings of the 2001 Particle Accelerator Conference*, Chicago, pp. 645-647 (2001).
Anferov, V., et. al. "Status of the Midwest Proton Radiotherapy Institute", *Proceedings of the 2003 Particle Accelerator Conference*, pp. 699-701 (2003).
Appun, J. "Various problems of magnet fabrication for high-energy accelerators" *Journal for All Engineers Interested in the Nuclear Field*, pp. 10-16 (1967) [Lang.: German], English bibliographic information (http://www.osti.gov/energycitations/product.biblio.jsp?osti_id=4442292).
Arduini, G., et. al. "Physical specifications of clinical proton beams from a synchrotron" *Med. Phys.* 23 (6), pp. 939-951 (Jun. 1996).
Bloch, C. "The Midwest Proton Therapy Center" *Application of Accelerators in Research and Industry, Proceedings of the Fourteenth Int 'l. Conf.*, Part Two, pp. 1253-1255 (Nov. 1996).
Blosser, H. G. "Compact Superconducting Synchrocyclotron Systems for Proton Therapy" *Nuclear Instruments & Methods in Physics Research*, Section B40-41, Part II, pp. 1326-1330 (Apr. 1989).
Blosser, H., et al, National Superconducting Cyclotron Laboratory, Michigan State University, Report MSUCL-760.
Blosser, H. G. "Synchrocyclotron Improvement Programs" *IEEE Transactions on Nuclear Science USA*, vol. 16, No. 3, Part I, pp. 405-414 (Jun. 1969).
Botha, A. H., et. al. "A New Multidisciplinary Separated-Sector Cyclotron Facility" IEEE Transactions on Nuclear Science, vol. NS-24, No. 3, pp. 1118-1120 (1977).
Source Search Cites of U.S. and Foreign Patents/Published applications in the name of Mitsubishi Denki Kabushiki Kaisha and Containing the Keywords (Proton and Synchrocyclotron), 8 pages.
Coupland, . "High-field (5 T) pulsed superconducting dipole magnet" Proceedings of the Institution of Electrical Engineers, vol. 121, No. 7, pp. 771-778 (Jul. 1974).
Cuttone, G., "Applications of a Particle Accelerators in Medical Physics" Istituto Nazionale di Fisica Nucleare-Laboratori Nazionali del Sud, V.S. Sofia, 44 Cantania, Italy (17 pages).
Flanz, et al., "Operation of a Cyclotron Based Proton Therapy Facility", Massachusetts General Hospital, Boston, MA 02114, pp. 1-4.
Foster, G. W. and Kashikhin, V. S. "Superconducting Superferric Dipole Magent with Cold Iron Core for the VLHC" IEEE Transactions on Applied Superconductivity, vol. 12, No. 1, pp. 111-115 (Mar. 2002).
Friesel, D. L. et al. "Design and Construction Progress on the IUCF Midwest Proton Radiation Institute" Proceedings of EPAC 2002, pp. 2736-2738 (2002).
Graffman, S., et al., Acta Radiol. Therapy Phys. Biol. 9, 1 (1970).
Graffman, et. al. "Proton radiotherapy with the Uppsala cyclotron. Experience and plans" Strahlentherapie, 161, No. 12, pp. 764-770 (1985).
Graffman, et. al. "Design Studies for a 200 MeV Proton Clinic for Radiotherapy" AIP Conference Proceedings: Cyclotrons—1972, No. 9, pp. 603-615 (1972).
Hede, Karyn, "Research Groups Promoting Proton Therapy "Lite"", Journal of the National Cancer Institute, vol. 98, No. 23, Dec. 6, 2006, pp. 1682-1684.
Heinz, . "Superconducting Pulsed Magnetic Systems for High-Energy Synchrotrons" *Proceedings of the Fourth International Cryogenic Engineering Conference*, pp. 55-63. (May 24-26, 1972).
Hentschel, R., et. al., "Plans for the German National Neutron Therapy Centre with a Hospital-Based 70 MeV Proton Cyclotron at University Hospital Essen/Germany" *Cyclotrons and their Applications, Proceedings of the Fifteenth International Conference on Cyclotrons and their Applications*, Caen, Franco, pp. 21-23 (Jun. 14-19, 1998).
Hepburn, et. al. "Superconducting Cyclotron Neutron Source for Therapy" *International Journal of Radiation Oncology Biology Physics*, vol. 3 complete, pp. 387-391 (1977).
Hirabayashi, H. "Development of Superconducting Magnets for Beam Lines and Accelerator at KEK" *IEEE Transaction on Magnetics*, vol. Mag-17, No. 1, pp. 728-731 (Jan. 1981).
"Indiana's mega-million proton therapy cancer center welcomes its first patients" [online] Press release, Health & Medicine Week, 2004, retrieved from NewsRx.com, Mar. 1, 2004, pp. 119-120.
Ishibashi, K. and McInturff, A., "Stress Analysis of Superconducting 10T Magnets for Synchrotron", Proceedings of the Ninth International Cryogenic Engineering Conference, pp. 513-516 (May 11-14, 1982).
Ishibashi, K. and McInturff, A. "Winding Design Study of Superconducting 10 T Dipoles for a Synchrotron" *IEEE Transactions on Magnetics*, vol. MAG-19, No. 3, pp. 1364-1367 (May 1983).
Jahnke, A., et. al. "First Superconducting Prototype Magnets for a Compact Synchrotron Radiation Source in Operation" *IEEE Transactions on Magnetics*, vol. 24, No. 2 (Mar. 1988), pp. 1230-1232.
Jones, D.T.L. "Progress with the 200 MeV Cyclotron Facility at the National Accelerator Centre" *Commission of the European Communities Radiation Protection Proceedings, Fifth Symposium on Neutron Dosimetry*, vol. II, pp. 989-998 (Sep. 17-21, 1984).

(56) References Cited

OTHER PUBLICATIONS

Jones, D. T. L. "Present Status and Future Trends of Heavy Particle Radiotherapy" *Cyclotrons and their Applications 1998, Proceedings of the Fifteenth International Conference on Cyclotrons and their Applications*, pp. 13-20 (Jun. 14-19, 1998).

Jones, and Dershem . "Synchrotron Radiation from Proton in a 20 TEV, 10 TESLA Superconducting Super Collider" *Proceedings of the 12th International Conference on High-Energy Accelerators*, pp. 138-140 (Aug. 11-16, 1983).

Jones, D. T. L. and Mills, S. J. "The South African National Accelerator Centre: Particle Therapy and Isotope Production Programmes" *Radiation Physics and Chemistry*, vol. 51, Nos. 4-6, pp. 571-578 (Apr.-Jun. 1998).

Jones, D. T. L., et. al. "Status Report of the NAC Particle Therapy Programme" *Stralentherapie und Onkologie*, vol. 175, Suppl. II, pp. 30-32 (Jun. 1999).

Jongen, Y., et. al. "Progress report on the IBA-SHI small cyclotron for cancer therapy" *Nuclear Instruments and Methods in Physics Research*, Section B, vol. 79, issue 1-4, pp. 885-889 (1993).

Jongen, Y., et. al. "The proton therapy system for MGH's NPTC: equipment description and progress report" *Bulletin du Cancer/ Radiotherapie, Proceedings of the meeting of the European Heavy Particle Therapy Group*, vol. 83, Suppl. 1, pp. 219-222 (1996).

Jongen, Y., et. al. "Development of a Low-cost Compact Cyclotron System for Proton Therapy" *National Institute of Radiol. Sci,*, No. 81, pp. 189-200 (1991).

Jongen, Y. et. al. "The proton therapy system for the NPTC: equipment description and progress report" *Nuclear Instruments and methods in Physics Research*, Section B, vol. 113, No. 1, pp. 522-525 (1996).

Kanai, et al., "Three-dimensional Beam Scanning for Proton Therapy," Nuclear Instruments and Methods in Physic Research, Sep. 1, 1983, The Netherlands, vol. 214, No. 23, pp. 491-496.

Karlin, D.L., et al., "Medical Radiology" (Moscow) 28, 13 (1983).

Karlin, D.L., et al., "The State and Prospects in the Development of the Medical Proton Tract on the Synchrocyclotron in Gatchina", Med. Radiol., Moscow, vol. 28(3), pp. 28-32 (Mar. 1983)(German with English Abstract on end of p. 32).

Kats, M.M. and Druzhinin, B.L. "Comparison of Methods for Irradiation Prone Patients" *Atomic Energy*, vol. 94, No. 2, pp. 120-123 (Feb. 2003).

Kats, M. M. and Onosovskii, K. K. "A Planar Magnetooptical System for the Irradiation of a Lying Patient with a Proton Beam from Various Directions" *Instruments and Experimental Techniques*, vol. 39, No. 1, pp. 127-131 (1996).

Kats, M. M. and Onosovskii, K. K. "A Simple, Compact, Flat System for the Irradiation of a Lying Patient with a Proton Beam from Different Directions" *Instruments and Experimental Techniques*, vol. 39, No. 1, pp. 132-134 (1996).

Koehler, A.M., et al., "Range Modulators for Protons and Heavy Ions," *Nuclear Instruments and Methods*, vol. 131, pp. 437-440 (1975).

Khoroshkov, V. S., et. al. "Moscow Hospital-Based Proton Therapy Facility Design" *Am. Journal Clinical Oncology: CCT*, vol. 17, No. 2, pp. 109-114 (Apr. 1994).

Kim, J. and Yun, C. "A Light-Ion Superconducting Cyclotron System for Multi-Disciplinary Users" *Journal of the Korean Physical Society*, vol. 43, No. 3, pp. 325-331 (Sep. 2003).

Kim, J.W., "An Eight Tesla Superconducting Magnet for Cyclotron Studies," Ph.D. Dissertation, Michigan State University, Department of Physics and Astronomy (1994).

Kim, J., et al., "Construction of 8T Magnet Test Stand for Cyclotron Studies", *IEEE Transactions on Applied Superconductivity*, vol. 3, No. 1, pp. 266-268 (Mar. 1993).

Kim, J., et al., "Design Study of a Superconducting Cyclotron for Heavy Ion Therapy", *Cyclotrons and Their Applications 2001, Sixteenth International Conference*, pp. 324-326 (May 13-17, 2001).

Kim, J. and Blosser, H., "Optimized Magnet for a 250 MeV Proton Radiotherapy Cyclotron", Cyclotrons and Their Applications 2001, Sixteenth International Conference, pp. 345-347 (May 2001).

Kim, J.W., et al., "Trim Coil System for the Riken Cyclotron Ring Cyclotron", *Proceedings of the 1997 Particle Accelerator Conference, IEEE*, vol. 3, pp. 214-235 (Dec. 1981). OR 3422-3424, 1998).

Kishida, N. and Yano, Y. "Beam Transport System for the RIKEN SSC (II)" *Scientific Papers of the Institute of Physical and Chemical Research*, vol. 75, No. 4, pp. 214-235 (Dec. 1981).

Krevet, et al, "Design of a Strongly Curved Superconducting Bending Magnet for a Compact Synchrotron Light Source", Advances in Cryogenic Engineering, vol. 33, pp. 25-32.

Meot, F., et. al. "ETOILE Hadrontherapy Project, Review of Design Studies" *Proceedings of EPAC 2002*, pp. 2745-2747 (2002).

Miyamoto, S., et. al. "Development of the Proton Therapy System" *The Hitachi Hyoron*, vol. 79, 10, pp. 775-779 (1997) [Lang: Japanese], English abstract (http://www.hitachi.com/rev/1998/revfeb98/rev4706.htm).

Montelius, A., et. al. "The Narrow Proton Beam Therapy Unit at the Svedberg Laboratory in Uppsala" *ACTA Oncologica*, vol. 30, pp. 739-745 (1991).

Moser, H.O., et al., "Nonlinear Beam Optics with Real Fields m Compact Storage Rings", Nuclear Instruments & Methods in Physics Research/Section B, B30, Feb. 1988, No. 1, pp. 105-109.

National Cancer Institute Funding (Senate-Sep. 21, 1992) (www.thomas.loc.gov/cgi-bin/query/z?r102:S21SE2-712 (2 pages).

Nicholson, J. "Applications of Proton Beam Therapy" *Journal of the American Society of Radiologic Technologists*, vol. 67, No. 5, pp. 439-441 (May/Jun. 1996).

Nolen, J.A., et al., "The Integrated Cryogenic—Superconducting Beam Transport System Planned for MSU", *Proceedings of the 12$^{th}$ International Conference on High-Energy Accelerators*, pp. 549-551 (Aug. 1983).

Norimine, T., et. al. "A Design of a Rotating Gantry with Easy Steering for Proton Therapy" *Proceedings of EPAC 2002*, pp. 2751-2753 (2002).

Okumura, T., et. al. "Overview and Future Prospect of Proton Radiotherapy" *Japanese Journal of Cancer Clinics*, vol. 43, No. 2, pp. 209-214 (1997) [Lang.: Japanese].

Okumura, T., et. al. "Proton Radiotherapy" *Japanese Journal of Cancer and Chemotherapy*, 10. 20, No. 14, pp. 2149-2155 (1993) [Lang.: Japanese].

Outstanding from Search Reports, "Accelerator of Polarized Portons at Fermilab," 20 pages, 2005.

Palmer, R. and Tollestrup, A. V. "Superconducting Magnet Technology for Accelerators" *Annual Review of Nuclear and Particle Science*, vol. 34, pp. 247-284 (1984).

Patent Assignee and Keyword Searches for Synchrocyclotron, Jan. 25, 2005 (77 pages).

"Patent Assignee Search Paul Scherrer Institute," Library Services at Fish & Richardson P.C., Mar. 20, 2007 (40 pages).

"Patent Prior Art Search for 'Proton Therapy System'," Library Services at Fish & Richardson P.C., Mar. 20, 2007 (46 pages).

Pavlovic, M. "Beam-optics study of the gantry beam delivery system for light-ion cancer therapy" *Nuclear Instruments and Methods in Physics Research*, Section A, vol. 399, No. 2, pp. 439-454(16) (Nov. 1997).

Pedroni, E. "Accelerators for Charged Particle Therapy: Performance Criteria from the User Point of View" *Cyclotrons and their Applications, Proceedings of the 13th International Conference*, pp. 226-233 (Jul. 6-10, 1992).

Pedroni, E. "Latest Developments in Proton Therapy" *Proceedings of EPAC 2000*, pp. 240-244 (2000).

Pedroni, E., et. al. "The 200-MeV proton therapy project at the Paul Scherrer Institute: Conceptual design and practical realization" *Medical Physics*, vol. 22, No. 1, pp. 37-53 (Jan. 1995).

Pedroni, E., et. al. "A Novel Gantry for Proton Therapy at the Paul Scherrer Institute" *Cyclotrons and Their Applications 2001: Sixteenth International Conference. AIP Conference Proceedings*, vol. 600, pp. 13-17 (2001).

Pedroni, E. and Enge, H. "Beam optics design of compact gantry for proton therapy" *Medical & Biological Engineering & Computing*, vol. 33, No. 3, pp. 271-277 (May 1995).

Pedroni, E. and Jermann, M. "SGSMP: Bulletin Mar. 2002 Proscan Project, Progress Report on the PROSCAN Project of PSI" [online] retrieved from www.sgsmp.ch/protA23.htm, (5 pages) Mar. 2002.

(56) References Cited

OTHER PUBLICATIONS

Potts, R., et. al. "MPWP6-Therapy III: Treatment Aids and Techniques" *Medical Physics*, vol. 15, No. 5, p. 798 (Sep./Oct. 1988).

Pourrahimi, S. et al., "Powder Metallurgy Processed Nb3Sn(Ta) Wire for High Field NMR magnets," IEEE Transactions on Applied Superconductivity, vol. 5, No. 2, (Jun. 1995), pp. 1603-1606.

Prieels, D., et. al. "The IBA State-of-the-Art Proton Therapy System, Performances and Recent Results" *Application of Accelerators in Research and industry—Sixteenth Int'l. Conf., American Institute of Physics*, vol. 576, pp. 857-860 (Nov. 1-5, 2000).

Rabin, M. S. Z., et. al. "Compact Designs for Comprehensive Proton Beam Clinical Facilities" *Nuclear Instruments & Methods in Physics Research*, Section B, vol. 40-41, Part II, pp. 1335-1339 (Apr. 1989).

Research & Development Magazine, "Proton Therapy Center Nearing Completion", vol. 41, No. 9, Aug. 1999 (2 pages)(www.rdmag.com).

Resmini, F., "Design Characteristics of the K=800 Superconducting Cyclotron at M.S.U.", Cyclotron Laboratory, Michigan State University, East Lansing, Michigan 48824, IEEE Transaction on Nuclear Science, vol. NS-26, No. 2, Apr. 1979 (8 pages).

RetroSearch "Berkeley 88-Inch Cyclotron 'RF' or 'Frequency Control'," Jan. 21, 2005 (36 pages).

RetroSearch "Berkeley 88-Inch Cyclotron," Jan. 24, 2005 (170 pages).

RetroSearch "Bernard Gottschalk, Cyclotron, Beams, Compensated Upstream Modulator, Compensated Scatter," Jan. 21, 2005 (20 pages).

RetroSearch "Cyclotron with 'RF' or 'Frequency Control'," Jan. 21, 2005 (49 pages).

RetroSearch Gottschalk, Bernard, Harvard Cyclotron Wheel, Jan. 21, 2005 (20 pages).

RetroSearch "Loma Linda University, Beam Compensation Foil Wedge," Jan. 21, 2005 (15 pages).

RetroSearch "Loma Linda University Beam Compensation," Jan. 21, 2005 (60 pages).

Revised Patent Keyword Search, Jan. 25, 2005 (88 pages).

Rifuggiato, D., et. al. "Status Report of the LNS Superconducting Cyclotron" *Nukleonika*, vol. 48, pp. S131-S134 (Supplement 2, 2003).

Rode, C. H. "Tevatron Cryogenic System" *Proceedings of the 12th International Conference on High-energy Accelerators, Fermilab*, pp. 529-535 (Aug. 11-16, 1983).

Salzburger, H., et al., "Superconducting Synchrotron Magnets Supraleitende Synchrotronmagnete", Siemens A.G., Erlangen (West Germany). Abteilung Technische Physik, Report No. BMFT-FB-T-75-25, Oct. 1975, p. 147, Journal Announcement: GRAI7619; STAR1415, Subm-Sponsored by Bundesmin. Fuer Forsch. U. Technol. In German; English Summary.

Schneider, R., et al., "Nevis Synchrocyclotron Conversion Program—RF System," *IEEE Transactions on Nuclear Science USA ns 16*(3) pp. 430-433 (Jun. 1969).

Schubert, J. R. "Extending the Feasibility Boundary of the Isochronous Cyclotron" Dissertation submitted to Michigan State University, 1997, Abstract http://adsabs.harvard.edu/abs/1998PhDT.......147S.

Shelaev, I. A., et. al. "Design Features of a Model Superconducting Synchrotron of JINR" *Proceedings of the 12th International Conference on High-energy Accelerators*, pp. 416-418 (Aug. 11-16, 1983).

Shintomi, T., et. al. "Technology and Materials for the Superconducting Super Collider (SSC) Project" [Lang.: Japanese], The Iron and Steel Institute of Japan 00211575, vol. 78, No. 8 (Aug. 1, 1992), pp. 1305-1313, http://ci.nii.ac.jp/naid/110001493249/en/ , 1992.

Slater, J. M., et. al. "Developing a Clinical Proton Accelerator Facility: Consortium-Assisted Technology Transfer" *Conference Record of the 1991 IEEE Particle Accelerator Conference: Accelerator Science and Technology*, vol. 1, pp. 532-536 (May 6-9, 1991).

Spiller, P., et. al. "The GSI Synchrotron Facility Proposal for Acceleration of High Intensity Ion and Proton Beams" *Proceedings of the 2003 Particle Accelerator Conference*, vol. 1, pp. 589-591 (May 12-16, 2003).

Stanford, A.L., et al., "Method of Temperature Control in Microwave Ferroelectric Measurements," Sperry Microwave Electronics Company, Clearwater, Florida, Sep. 19, 196 (1 page).

Tadashi, I., et al., "Large superconducting super collider (SSC) in the planning and materials technology", vol. 78, No. 8 (Aug. 1, 1992), pp. 1305-1313, The Iron and Steel Institute of Japan 00211575.

"The Davis 76-Inch Isochronous Cyclotron", Beam On: Crocker Nuclear Laboratory, University of California.

"The K250 Proton therapy Cyclotron," National Superconducting Cyclotron Laboratory at Michigan State University (NSCL), retrieved from: http://www.nscl.msu.edu/tech/accelerators/k250.html , Feb. 2005.

"The K250 Proton-therapy Cyclotron Photo Illustration," National Superconducting Cyclotron Laboratory at Michigan State University (NSCL), retrieved from: http://www.nscl.msu.edu/media/image/experimental-equipment-technology/250.html , Feb. 2005.

Toyoda, E., "Proton Therapy System", Sumitomo Heavy Industries, Ltd.

Trinks, U., et. al. "The Tritron: A Superconducting Separated-Orbit Cyclotron" *Nuclear Instruments and Methods in Physics Research*, Section A, vol. 244, pp. 273-282 (1986).

Tsuji, H., "Cancer Therapy by Proton Beam: Latest State and Future Prospects", *Isotope News*, No. 459, pp. 2-7 (1992).

Tsuji, H. "The Future and Progress of Proton Beam Radiotherapy" *Journal of Japanese Society for Therapeutic Radiology and Oncology*, vol. 6, No. 2, pp. 63-76 (1994).

UC Davis School of Medicine, "Unlikely Partners Turn Military Defense into Cancer Offense", Current Issue Summer 2008, Sacramento, California, pp. 1-2.

Umegaki, K., et. al. "Development of an Advanced Proton Beam Therapy System for Cancer Treatment" *Hitachi Hyoron*, vol. 85, No. 9, pp. 605-608 (2003) [Lang.: Japanese], English abstract, http://www.hitachi.com/ICSFiles/afieldfile/2004/06/01/r2003_04_104.pdf or http://www.hitachi.com/rev/archive/2003/2005649_12606.html (full text) [Hitachi, vol. 52, No. 4. Dec. 2003].

Umezawa, M., et. al. "Beam Commissioning of the new Proton Therapy System for University of Tsukuba" *Proceedings of the 2001 Particle Accelerator Conference*, vol. 1, pp. 648-650 (Jun. 18-22, 2001).

van Steenbergen, A. "The CMS, a Cold Magnet Synchrotron to Upgrade the Proton Energy Range of the BNL Facility" *IEEE Transactions on Nuclear Science*, vol. 18, Issue 3, pp. 694-698 (Jun. 1971).

van Steenbergen, A. "Superconducting Synchroton Development at BNL" *Proceedings of the 8th International Conference on High-Energy Accelerators CERN 1971*, pp. 196-198 (1971).

Vandeplassche, D., et. al. "235 MeV Cyclotron for MGH's Northeast Proton Therapy Center (NPTC): Present Status" EPAC 96, *Fifth European Partical Accelerator Conference*, vol. 3, pp. 2650-2652 (Jun. 10-14, 1996).

Vorobiev, L.G., et al., "Concepts of a Compact Achromatic Proton Gantry with a Wide Scanning Field", Nuclear Instruments and Methods in Physics Research, Section A., vol. 406, No. 2, pp. 307-310 (1998).

Vrenken, H., et. al. "A Design of a Compact Gantry for Proton Therapy with 2D-Scanning" *Nuclear Instruments and Methods in Physics Research*, Section A, vol. 426, No. 2, pp. 618-624 (1999).

Wikipedia, "Cyclotron" http://en.wikipedia.org/wiki/Cyclotron (originally visited Oct. 6, 2005, revisited Jan. 28, 2009)(7 pages).

Wikipedia, "Synchrotron" http://en.wikipedia.org/wiki/Synchrotron (originally visited Oct. 6, 2005, revisited Jan. 28, 2009)(7pages).

Worldwide Patent Assignee Search, Jan. 24, 2005 (224 pages).

Worldwide Patent Keyword Search, Jan. 24, 2005 (94 pages).

Wu, X., "Conceptual Design and Orbit Dynamics in a 250 MeV Superconducting Synchrocyclotron," Ph.D. Dissertation, Michigan State University, Department of Physics and Astronomy (1990).

York, R.C., et al., "Present Status and Future Possibilities at NSCL-MSU", EPAC 94, Fourth European Particle Accelerator Conference, pp. 554-556 (Jun. 1994).

York, R.C., et al., "The NSCL Coupled Cyclotron Project—Overview and Status", *Proceedings of the Fifteenth International Conference on Cyclotrons and their Applications*, pp. 687-691 (Jun. 1998).

(56) References Cited

OTHER PUBLICATIONS

Yudelev, M., et. al. "Hospital Based Superconducting Cyclotron for Neutron Therapy: Medical Physics Perspective" *Cyclotrons and their applications 2001, 16th International Conference. American Institute of Physics Conference Proceedings*, vol. 600, pp. 40-43 (May 13-17, 2001) http://www.osti.gov/energycitations/product.biblio.jsp? osti_id=20468164 http://adsabs.harvard.edu/abs/2001AIPC.. 600...40Y http://scitation.aip.org/getabs/servlet/GetabsServlet?prog=normal&id=APCPCS000600000001000040000001&id type=cvips&gifs=yes.
Zherbin, E. A., et al., "Proton Beam Therapy at the Leningrad Synchrocyclotron (Clinicomethodological Aspects and Therapeutic Results)", pp. 17-22, Aug. 1987, vol. 32(8)(German with English abstract on pp. 21-22).
18$^{th}$ Japan Conference on Radiation and Radioisotopes [Japanese], Nov. 25-27, 1987, 9 pages.
"510(k) Summary: Ion Beam Applications S.A.", FDA, Apr. 13, 2001.
"510(k) Summary: Optivus Proton Beam Therapy System", Jul. 21, 2000, 5 pages.
U.S. Appl. No. 11/601,056, filed Nov. 17, 2006, including application as filed (including pending claims).
European Search Report from application No. EP 06838033.6 (PCT/US2006/044853) mailed May 11, 2009 (69 pages).
European Patent Office communication for application No. 06838033.6, patent No. 1949404, mailed Aug. 5, 2009 (1 page).
Invitation to Pay Additional Fees and, where applicable, Protest Fees with partial search report for application No. PCT/US2008/077513 mailed Jul. 3, 2009 (62 pages).
Office action and response history of U.S. Appl. No. 11/601,056, to Aug. 24, 2009.
International Search Report and Written Opinion mailed Oct. 1, 2009 in PCT application No. PCT/US2008/077513 (73 pages).
International Preliminary Report on Patentability from PCT application No. PCT/US2008/084695, mailed Jun. 10, 2010 (10 pages).
International Preliminary Report on Patentability from PCT application No. PCT/US2008/084699, mailed Jun. 10, 2010 (8 pages).
International Preliminary Report on Patentability from PCT application No. PCT/US2007/086109, mailed Jun. 10, 2010 (7 pages).
European Patent Office communication from European application No. 07868958.5, mailed Jul. 16, 2010 (2 pages).
Voluntary amendment filed Apr. 18, 2011 in corresponding Chinese application No. CN200780102281.X , including English translation of claim amendments (10 pages).
Non Final Office Action from U.S. Appl. No. 12/618,297 mailed May 13, 2011 (44 pages).
Non Final Office Action from U.S. Appl. No. 12/275,103 mailed Feb. 1, 2011 (6 pages).
Response to Non Final Office Action issued Feb. 1, 2011 in U.S. Appl. No. 12/275,103, filed May 2, 2011 (13 pages).
European Search Report from corresponding European application No. 11165422.4 mailed Aug. 8, 2011 (118 pages).
European Search Report from corresponding European application No. 11165423.2 mailed Aug. 8, 2011 (118 pages).
European Communication from corresponding European application No. 11165422.4 mailed Sep. 2, 2011 (5 pages).
European Communication from corresponding European application No. 11165423.2 mailed Sep. 2, 2011 (5 pages).
Chinese Office action from Chinese application No. 200680051421.0 issued Aug. 22, 2011 (4 pages).
Chinese Office action from Chinese application No. 200680051421.0 issued Mar. 21, 2011 (6 pages).
Chinese Office action from Chinese application No. 200680051421.0 issued Dec. 25, 2009 (8 pages).
Canadian Office action from Canadian application No. 2,629,333 issued May 11, 2011 (2 pages).
Canadian Office action from Canadian application No. 2,629,333 issued Aug. 30, 2010 (5 pages).
European Communication from European application No. 06838033.6 mailed Apr. 20, 2010 (7 pages).
European Patent Office communication from European application No. 08855024.9, mailed Jul. 30, 2010 (2 pages).
European Patent Office communication from European application No. 08856764.9, mailed Jul. 30, 2010 (2 pages).
Chinese Office action from Chinese application No. 200880125918.1, mailed Sep. 15, 2011 (111 pages).
Chinese Office action from Chinese application No. 200880125832.9, mailed Sep. 22, 2011 (11 pages).
Response to Chinese Office action of Jan. 25, 2010 in Chinese application No. 200680051421.0, filed Jun. 24, 2010 (34 pages).
Response to European Communication of Apr. 20, 2010, from European application No. 06838033.6, filed Nov. 2, 2010 (13 pages).
European Communication from European application No. 07868958.5, mailed Nov. 26, 2010 (50 pages).
Response to European Communication of Jul. 16, 2010 in European application No. 07868958.5 filed Aug. 26, 2010 (9 pages).
Response to European Communication of Nov. 26, 2010 in European application No. 07868958.5, filed Mar. 28, 2011 (9 pages).
Office action from U.S. Appl. No. 11/948,662, mailed Oct. 14, 2011 (5 pages).
Response to Office action mailed Oct. 14, 2011 from U.S. Appl. No. 11/648,662, filed Dec. 14, 2011 (12 pages).
Chinese Office Action from Chinese Application No. 200780102281.X issued Dec. 7, 2011 with English translation (23 pages).
Response to Chinese Office Action from corresponding Chinese application No. 200880125832.9 issued Sep. 22, 2011, filed on Apr. 9, 2012 with English translation (23 pages).
Chinese Office action from corresponding Chinese application No. 200880125832.9, mailed Jun. 5, 2012. English Translation will follow upon receipt (4 pages).
Beeckman, W., et. al. "Preliminary design of a reduced cost proton therapy facility using a compact, high field isochronous cyclotron" *Nuclear Instruments and Methods in Physics Reasearch B56/57*, pp. 1201-1204 (1991).
Bellomo, G., et al., "The Superconducting Cyclotron Program at Michigan State University" *Bulletin of the American Physical Society*, vol. 25, No. 7, pp. 767 (Sep. 1980).
Benedikt, M. and Carli, C. "Matching to Gantries for Medical Synchrotrons" *IEEE Proceedings of the 1997 Particle Accelerator Conference*, pp. 1379-1381 (1997).
Bieth, C., et. al. "A Very Compact Protontherapy Facility Based on an Extensive Use of High Temperature Superconductors (HTS)" *Cyclotrons and their Applications 1998*, Proceedings of the Fifteenth International Conference on Cyclotrons and their Applications, Caen, pp. 669-672 (Jun. 14-19, 1998).
Bigham, C.B. "Magnetic Trim Rods for Superconducting Cyclotrons," Nuclear Instruments and Methods (North-Holland Publishing Co.) 141 (1975), pp. 223-228.
Blackmore, E. W., et. al. "Operation of the Triumf Proton Therapy Facility" *IEEE Proceedings of the 1997 Particle Accelerator Conferenc*, vol. 3, pp. 3831-3833 (May 12-16, 1997).
Bloch, C. "The Midwest Proton Therapy Center" *Application of Accelerators in Research and Industry, Proceedings of the Fourteenth Int'l. Conf*, Part Two, pp. 1253-1255 (Nov. 1996).
Blosser, H., et. al. "A Compact Superconducting Cyclotron for the Production of High Intensity Protons" *Proceedings of the 1997 Particle Accelerator Conference*, vol. 1, pp. 1054-1056 (May 12-16, 1997).
Blosser, H., et al., "Advances in Superconducting Cyclotrons at Michigan State University", Proceedings of the 11$^{th}$ International Conference on Cyclotrons and their Applications, pp. 157-167 (Oct. 1986), Tokyo.
Blosser, H., "Application of Superconductivity in Cyclotron Construction", *Ninth International Conference on Cyclotrons and their Applications*, pp. 147-157 (Sep. 1981).
Blosser, H. "Applications of Superconducting Cyclotrons" *Twelfth International Conference on Cyclotrons and Their Applications*, pp. 137-144 (May 8-12, 1989).
Blosser, H., et al., "Characteristics of a 400 (Q2/A) MeV Super-Conducting Heavy-Ion Cyclotron", Bulletin of the American Physical Society, p. 1026 (Oct. 1974).

(56) References Cited

OTHER PUBLICATIONS

Blosser, H.G. "Compact Superconducting Synchrocyclotron Systems for Proton Therapy" *Nuclear Instruments & Methods in Physics Research*, Section B40-41, Part II, pp. 1326-1330 (Apr. 1989).
Blosser, H.G., "Future Cyclotrons" AIP, *The Sixth International Cyclotron Conference*, pp. 16-32 (1972).
Blosser, H., et. al. "Medical Accelerator Projects at Michigan State Univ." *IEEE Proceedings of the 1989 Particle Accelerator Conference*, vol. 2, pp. 742-746 (Mar. 20-23, 1989).
Blosser, H.G., "Medical Cyclotrons", *Physics Today*, Special Issue Physical Review Centenary, pp. 70-73 (Oct. 1993).
Blosser, H., et al., "Preliminary Design Study Exploring Building Features Required for a Proton Therapy Facility for the Ontario Cancer Institute", MSUCL-760a (Mar. 1991).
Blosser, H., Present and Future Superconducting Cyclotrons, *Bulletin of the American Physical Society*, vol. 32, No. 2, p. 171 (Feb. 1987), Particle Accelerator Conference, Washington, D.C. 1987.
Blosser, H., et al., "Problems and Accomplishments of Superconducting Cyclotrons", Proceedings of the 14$^{th}$ International Conference, Cyclotrons and Their Applications, pp. 674-684 (Oct. 1995).
Blosser, H.G., "Program on the Coupled Superconducting Cyclotron Project", *Bulletin of the American Physical Society*, vol. 26, No. 4, p. 558 (Apr. 1981).
Blosser, H., et al., "Superconducting Cyclotron for Medical Application", *IEEE Transactions on Magnetics*, vol. 25, No. 2, pp. 1746-1754 (Mar. 1989).
Blosser, H.G., et al., "Superconducting Cyclotrons", Seventh International Conference on Cyclotrons and their Applications, pp. 584-594 (Aug. 19-22, 1975).
Blosser, H.G., "Superconducting Cyclotrons at Michigan State University", Nuclear Instruments & Methods in Physics Research, vol. B 24/25, part II, pp. 752-756 (1987).
Blosser, H.G. "Synchrocyclotron Improvement Programs" *IEEE Transactions on Nuclear Science USA*, vol. 16, No. 3, Part I, pp. 405-414 (Jun. 1969).
Blosser, H.G., "The Michigan State University Superconducting Cyclotron Program", Nuclear Science, vol. NS-26, No. 2, pp. 2040-2047 (Apr. 1979).
Botha, A.H., et. al. "A New Multidisciplinary Separated-Sector Cyclotron Facility" IEEE Transactions on Nuclear Science, vol. NS-24, No. 3, pp. 1118-1120 (1977).
Chichili, D.R., et al., "Fabrication of Nb3Sn Shell-Type Coils with Pre-Preg Ceramic Insulation," American Institute of Physics Conference Proceedings, AIP USA, No. 711, (XP-002436709, ISSN: 0094-243X), 2004, pp. 450-457.
Chong, C.Y., et al., Radiology Clinic North American 7, 3319 (1969).
Chu, et. al. "Instrumentation for Treatment of Cancer Using Proton and Light-ion Beams" Review of Scientific Instruments, 64 (8), pp. 2055-2122 (Aug. 1993).
Cole, et. al. "Design and Application of a Proton Therapy Accelerator", Fermi National Accelerator Laboratory, IEEE, 1985.
Conradie, et. al. "Proposed New Facilities for Proton Therapy at iThemba Labs" Proceedings of EPAC, pp. 560-562 (2002).
C/E Source of Ions for Use in Sychro-Cyclotrons Search, Jan. 31, 2005, 9 pages.
Coupland, "High-field (5 T) pulsed superconducting dipole magnet" Proceedings of the Institution of Electrical Engineers, vol. 121, No. 7, pp. 771-778 (Jul. 1974).
Coutrakon, et. al. "A prototype beam delivery system for the proton medical accelerator at Loma Linda" Medical Physics, vol. 18(6), pp. 1093-1099 (Nov./Dec. 1991).
Coutrakon, G et al. "Proton Synchrotrons for Cancer Therapy" Application of Accelerators in Research and Industry—Sixteenth International Conf., American Institute of Physics, vol. 576, pp. 861-864 (Nov. 1-5, 2000).
"CPAC Highlights Its Proton Therapy Program at ESTRO Annual Meeting", TomoTherapy Incorporated, Sep. 18, 2008, Madison, Wisconsin, pp. 1-2.

Dahl, P., "Superconducting Magnet System" American Institute of Physics, AIP Conference Proceedings, vol. 2, pp. 1329-1376 (1987-1988).
Dialog Search, Jan. 31, 2005 (18 pages).
Dugan, G. et al. "Tevatron Status" IEEE, Particle Accelerator Conference, Accelerator Science & Technology (1989), pp. 426-430.
Eickhoff, et al. "The Proposed Accelerator Facility for Light Ion Cancer Therapy in Heidelberg" Proceedings of the 1999 Particle Accelerator Conference, New York, pp. 2513-2515 (1999).
Enchevich, B. et al., "Minimizing Phase Losses in the 680 MeV Synchrocyclotron by Correcting the Accelerating Voltage Amplitude," *Atomnaya Energiya* 26:(3), pp. 315-316 (1969).
Endo, K., et. al., "Compact Proton and Carbon Ion Synchrotons for Radiation Therapy" Proceedings of EPAC 2002, Paris France, pp. 2733-2735 (2002).
Flanz, et al., "Large Medical Gantries", 1995 Particle Accelerator Conference, Massachusetts General Hospital, pp. 1-5 (1995).
Flanz, et al., "The Northeast Proton Therapy Center at Massachusetts General Hospital", Fifth Workshop on Heavy Charge Particles in Biology and Medicine, GSI, Darmstadt (Aug. 1995).
Flanz, et. al. "Treating Patients with the NPTC Accelerator Based Proton Treatment Facility" Proceedings of the 2003 Particle Accelerator Conference (2003), pp. 690-693.
Flood, W. S. and Frazier, P. E. "The Wide-Band Driven RF System for the Berkeley 88-Inch Cyclotron" American Institute of Physics, Conference Proceedings., No. 9, 459-466 (1972).
Foster, G.W. and Kashikhin, V.S. "Superconducting Superferric Dipole Magent with Cold Iron Core for the VLHC" IEEE Transactions on Applied Superconductivity, vol. 12, No. 1, pp. 111-115 (Mar. 2002).
Friesel, D.L. et al. "Design and Construction Progress on the IUCF Midwest Proton Radiation Institute" Proceedings of EPAC 2002, pp. 2736-2738 (2002).
Fukumoto, "Cyclotron Versus Synchrotron for Proton Beam Therapy", KEK Prepr., No. 95-122, pp. 533-536 (1995).
Fukumoto, et. al., "A Proton Therapy Facility Plan" Cyclotrons and their Applications, Proceedings of the 13th International Conference, Vancouver, Canada, pp. 258-261 (Jul. 6-10, 1992).
Gordon, et. al. "Design Study for a Compact 200 MeV Cyclotron" AIP Conference Proceedings Sixth International Cyclotron Conference, No. 9, pp. 78-86 (1972).
Gordon, M. M., "Extraction Studies for a 250 MeV Superconducting Synchrocyclotron", Proceedings of the 1987 IEEE Particle Accelerator Conference: Accelerator Engineering and Technology, pp. 1255-1257 (1987).
Goto, A. et al., "Progress on the Sector Magnets for the Riken SRC," American Institute of Physics, CP600, Cyclotrons and Their Applications 2001, Sixteenth International Conference (2001), pp. 319-323.
Koto, M. and Tsujii, H. "Future of Particle Therapy" *Japanese Journal of Cancer Clinics*, vol. 47, No. 1, pp. 95-98 (2001) [Lang.: Japanese], English abstract (http://sciencelinks.jp/j-east/article/200206/000020020601A0511453.php).
Kraft, G. et al., "Hadrontherapy in Oncology", U. Amaldi and Larrsson, editors Elsevier Science, 1994.
Larsson, B. "Biomedical Program for the Converted 200-MeV Synchrocyclotron at the Gustaf Werner Institute" Radiation Research, 104, pp. S310-S318 (1985).
Larsson, B., et al., Nature 182, 1222 (1958).
Lawrence, J.H., Cancer 10, 795 (1957).
Lawrence, J.H., et al., "Heavy particles in acromegaly and Cushing's Disease," in Endocrine and Norendocrine Hormone Producing Tumors (Year Book Medical Chicago, 1973), pp. 29-61.
Lawrence, J.H., et al., "Successful Treatment of Acromegaly: Metabolic and Clinical Studies in 145 Patients", The Journal of Clinical Endocrinology and Metabolism, vol. 31, No. 2, Aug. 1970.
Lawrence, J.H., et al., Treatment of Pituitary Tumors, (Excerpta medica, Amsterdam/American Elsevier, New York, 1973), pp. 253-262.
Lecroy, W., et al., "Viewing Probe for High Voltage Pulses", *Review of Scientific Instruments USA* 31(12), p. 1354 (Dec. 1960).
Linfoot, J.A., et al., "Acromegaly," in Hormonal Proteins and Peptides, edited by C.H. Li, (1975), pp. 191-246.

(56) References Cited

OTHER PUBLICATIONS

Literature Author and Keyword Search, Feb. 14, 2005 (44 pages).
Literature Author and Keyword Searches (Synchrotron), Jan. 25, 2005 (78 pages).
Literature Keyword Search, Jan. 24, 2005 (96 pages).
Literature Search, Jan. 26, 2005 (36 pages).
Literature Search and Keyword Search for Synchrocyclotron, Jan. 25, 2005 (68 pages).
Literature Search by Company Name/Component Source, Jan. 24, 2005 (111 pages).
Livingston, M. S., et. al. "A Capillary Ion Source for the Cyclotron" *Review Science Instruments*, vol. 10:63, pp. 63-67, (Feb. 1939).
"LLNL, UC Davis Team Up to Fight Cancer", Lawrence Livermore National Laboratory, Apr. 28, 2006, SF-06-04-02, Livermore, California, pp. 1-4.
Mandrillon, P. "High Energy Medical Accelerators" *EPAC 90, 2nd European Particle Accelerator Conference*, vol. 2, (Jun. 12-16, 1990), pp. 54-58.
Marti, F., et al., "High Intensity Operation of a Superconducting Cyclotron", *Proceedings of the 14the International Conference, Cyclotrons and Their Applications*, pp. 45-48 (Oct. 1995).
Martin, P. "Operational Experience with Superconducting Synchrotron Magnets" *Proceedings of the 1987 IEEE Particle Accelerator Conference*, vol. 3 of 3, pp. 1379-1382 (Mar. 16-19, 1987).
Schillo, M., et. al. "Compact Superconducting 250 MeV Proton Cyclotron for the Psi Proscan Proton Therapy Project" *Cyclotrons and Their Applications 2001, Sixteenth International Conference*, pp. 37-39 (2001).
Schneider et al., "Superconducting Cyclotrons," IEEE Transactions on Magnetics, vol. MAG-11, No. 2, Mar. 1975, New York, pp. 443-446.
Schneider, R., et al., "Nevis Synchrocyclotron Conversion Program—RF System," *IEEE Transactions on Nuclear Science USA* ns. 16(3) pp. 430-433 (Jun. 1969).
Schreuder, H.W. "Recent Developments in Superconducting Cyclotrons" *Proceedings of the 1995 Particle Accelerator Conference*, vol. 1, pp. 317-321 (May 1-5, 1995).
Schreuder, A. N., et. al. "The Non-orthogonal Fixed Beam Arrangement for the Second Proton Therapy Facility at the National Accelerator Centre" *Application of Accelerators in Research and Industry, American Institute of Physics, Proceedings of the Fifteenth International Conference*, Part Two, pp. 963-966 (Nov. 1998).
Schubert, J. R. "Extending the Feasibility Boundary of the Isochronous Cyclotron" Dissertation submitted to Michigan State University, 1997, Abstract lap://adsabs.harvard.edu/abs/1998PhDT . . . 147S.
Schubert, J. and Blosser, H. "Conceptual Design of a High Field Ultra-Compact Cyclotron for Nuclear Physics Research" *Proceedings of the 1997 Particle Accelerator Conference*, vol. 1, pp. 1060-1062 (May 12-16, 1997).
Shelaev, I.A., et. al. "Design Features of a Model Superconducting Synchrotron of JINR" *Proceedings of the 12th International Conference on High-energy Accelerators*, pp. 416-418 (Aug. 11-16, 1983).
Shintomi, T., et. al. "Technology and Materials for the Superconducting Super Collider (SSC) Project" [Lang.: Japanese], The Iron and Steel Institute of Japan 00211575, vol. 78, No. 8 (19920801), pp. 1305-1313, http://ci.nii.ac.jp/naid/110001493249/en/, 1992.
Sisterson, J. M. "World Wide Proton Therapy Experience in 1997" *The American Insitute of Physics, Applications of Accelerators in Research and Industry, Proceedings of the Fifteenth International Conference*, Part Two, pp. 959-962 (Nov. 1998).
Sisterson, J. M. "Clinical Use of Proton and Ion Beams From a World-Wide Perspective" *Nuclear Instruments and Methods in Physics Research*, Section B, vols. 40-41, pp. 1350-1353 (1989).
Slater, J. M., et. al. "Development of a Hospital-Based Proton Beam Treatment Center" *International Journal of Radiation Oncology Biology Physics*, vol. 14, No. 4, pp. 761-775 (Apr. 1988).
Slater, J. M., et. al. "Developing a Clinical Proton Accelerator Facility: Consortium-Assisted Technology Transfer" *Conference Record of the 1991 IEEE Particle Accelerator Conference: Accelerator Science and Technology*, vol. 1, pp. 532-536 (May 6-9 1991).
Smith, A., et. al. "The Northeast Proton Therapy Center at Massachusetts General Hospital" *Journal of Brachytherapy International*, pp. 137-139 (Jan. 1997).
Snyder, S. L. And Marti, F. "Central region design studies for a proposed 250 MeV proton cyclotron" *Nuclear Instruments and Methods in Physics Research*, Section A, vol. 355, pp. 618-623 (1995).
Soga, F. "Progress of Particle Therapy in Japan" *Application of Accelerators in Research and Industry, American Institute of Physics, Sixteenth International Conference*, pp. 869-872 (Nov. 2000).
Spiller, P., et. al. "The GSI Synchrotron Facility Proposal for Acceleration of High Intensity Ion and Proton Beams" *Proceedings of the 2003 Particle Accelerator Conference*, vol. 1, pp. 589 - 591 (May 12-16, 2003).
Superconducting Cyclotron Contract awarded by Paul Scherrer Institute (PSI), Villigen, Switzerland, http://www.accel.de/News/superconducting_cyclotron_contract.html Feb. 3, 2005.
Takada, Yoshihisa Tsukumba, "A review of rotating gantries for heavy charged particle therapy," Symposium of Research Center for Charged Particle Therapy on Fundamental development of the charged particle therapy, Chiba (Japan), Nov. 13-14, 2001.
Takada, Y. "Conceptual Design of a Proton Rotating Gantry for Cancer Therapy" *Japanese Journal of Medical Physics*, vol. 15, No. 4, pp. 270-284 (1995).
Takayama, T., et al., "Compact Cyclotron for Proton Therapy," *Proceedings of the $8^{th}$ Symposium on Accelerator Science and Technology*, Japan (Nov. 25-27, 1991) pp. 380-382.
Teng, L. C. "The Fermilab Tevatron" *Coral Gables 1981, Proceedings, Gauge Theories, Massive Neutrinos, and Proton Decay*, pp. 43-62 (1981).
The Journal of Practical Pharmacy, vol. 46, No. 1, 1995, pp. 97-103. [Japanese].
"The K100 Neutron-therapy Cyclotron," National Superconducting Cyclotron Laboratory at Michigan State University (NSCL), retrieved from: http://www.nscl.msu.edu/tech/accelerators/k100, Feb. 2005.
"The K250 Proton therapy Cyclotron," National Superconducting Cyclotron Laboratory at Michigan State University (NSCL), retrieved from: http://www.nscl.msu.edu/tech/accelerators/k250.html, Feb. 2005.
"The K250 Proton-therapy Cyclotron Photo Illustration," National Superconducting Cyclotron Laboratory at Michigan State University (NSCL), retrieved from: http://wwvv.nscl.msu.edremedia/image/experimental-equipment-teclmology/250.html , Feb. 2005.
Tobias, C.A., et al., Cancer Research 18, 121 (1958).
Tom, J. L. "The Use of Compact Cyclotrons for Producing Fast Neutrons for Therapy in a Rotatable Isocentric Gantry" *IEEE Transaction on Nuclear Science*, vol. 26, No. 2, pp. 2294-2298 (Apr. 1979).
Non-Final Office Action with English translation from Japanese Patent Office 2010-536131, Jun. 4, 2013 (10 pages). **JP Action first cited and filed with USPTO on Jun. 13, 2012**.
Blosser, H., et al, "Progress Toward an Experiment to Study the Effect of RF Grounding in an Internal Ion Source on Axial Oscillations of the Beam in a Cyclotron", National Superconducting Cyclotron Laboratory, Michigan State University, Report MSUCL-760, CP600, Cyclotrons and Their Applications 2001, Sixteenth International Conference, 2001 pp. 274-276.
Cuttone, G., "Applications of a Particle Accelerators in Medical Physics" Istituto Nazionale di Fisica Nucleare-Laboratori Nazionali del Sud, V.S. Sofia, 44 Cantania, Italy, Jan. 2010 (17 pages).
Source Search Cites of U.S. And Foreign Patents/Published applications in the name of Mitsubishi Denki Kabushiki Kaisha and Containing the Keywords (Proton and Synchrocyclotron), Jan. 2005, 8 pages.
Flanz, et al., "Operation of a Cyclotron Based Proton Therapy Facility", Massachusetts General Hospital, Boston, MA, 2010, pp. 1-4.
Krevet, et al, "Design of a Strongly Curved Superconducting Bending Magnet for a Compact Synchrotron Light Source", Advances in Cryogenic Engineering, vol. 33, pp. 25-32, 1988.

(56) References Cited

OTHER PUBLICATIONS

Salzburger, H., et al., "Superconducting Synchrotron Magnets Supraleitende Synchrotronmagnete", Siemens A.G., Erlangen (West Germany). Abteilung Technische Physik, Report No. BMFT-FB-T75-25, Oct. 1975, p. 147, Journal Announcement: GRAI7619; STAR1415, Subm-Sponsored by Bundesmin. Fuer Forsch. U. Technol. In German; English Summary.
Stanford, A.L., et al., "Method of Temperature Control in Microwave Ferroelectric Measurements," Sperry Microwave Electronics Company, Clearwater, Florida, Sep. 19, 1960 (1 page).
Tadashi, I., et al., "Large superconducting super collider (SSC) in the planning and materials technology", vol. 78, No. 8 (Aug. 1992), pp. 1305-1313, The Iron and Steel Institute of Japan 00211575.
"The Davis 76-Inch Isochronous Cyclotron", Beam On: Crocker Nuclear Laboratory, University of California, Feb. 9, 2009 (1 page).
Toyoda, E., "Proton Therapy System", Sumitomo Heavy Industries, Ltd., 2000.
Office action from Canadian Application No. 2,574,122 mailed Nov. 14, 2012 (6 pages).
Response to Chinese Patent application No. 200880125832.9 office action filed May 20, 2013, 6 pages.
Response to Office action from Canadian Application No. 2,574,122 mailed Nov. 14, 2012, filed May 13, 2013 (32 pages).
Office action from Taiwan IPO Pat. Application No. 097138794, received Feb. 8, 2012, 7 pages.
Response to Office Action for Chinese Patent Office Appln 200880125832.9 filed on Apr. 9, 2012.
Non-Final Office action mailed Jun. 14, 2013 in U.S. Appl. No. 13/618,848, 9 pgs.
Response to office action for Chinese Patent App. No. 200880125832.9 filed Oct. 22, 2012, 7 pages.
Non-Final Office Action from Japanese Patent Office 2010-536131, Jun. 4, 2013, 5 pages.
Badano et al., Proton-Ion Medical Machine Study (PIMMS) Part I, PIMMS, Jan. 1999, 238 pages.
"Beam Delivery and Properties" Journal of the ICRU, vol. 7 No. 2, 2007, 20 pages.
Peggs et al. "A Survey of Hadron Therapy Accelerator Technologies" Particle Accelerator Conference, Jun. 25-29, 2007, 7 pages.
Pedroni et al., "Latest Developments in Proton Therapy" Proceedings of EPAC, Vienna Austria, 2000, 5 pages.
Collins, et al., "The Indiana University Proton Therapy System", Proceedings of EPAC 2006, Edinburgh, Scotland, 3 pages.
Paganetti et al., "Proton Beam Radiotherapy—The State of the Art" Springer Verlag, Heidelberg, ISBN 3-540-00321-5, Oct. 2005, 36 pages.
Pedroni, "Status of Proton Therapy: results and future trends" Paul Scherrer Institute, Division of Radiation Medicine, 5 pages, 2007.
Kimstrand, "Beam Modelling for Treatment Planning of Scanned Proton Beams" Digital Comprehensive Summaries of Uppsala dissertations from the Faculty of Medicine 330, Uppsala Universitet, 2008, 58 pages.
Marchand et al., "IBA Proton Pencil Beam Scanning: an Innovative Solution for Cancer Treatement", Proceedings of EPAC 2000, Vienna, Austria, 3 pages.
Alonso, "Magnetically Scanned Ion Beams for Radiation Therapy" Accelerator & Fusion Research Division, Lawrence Berkeley Laboratory, Berkeley, CA, Oct. 1988, 13 pages.
Moyers et al., "A Continuously Variable Thickness Scatterer for Proton Beams Using Self-compensating Dual Linear Wedges" Loma Linda University Medical Center, Dept. of Radiation Medicine, Loma Linda, CA, Nov. 2, 1992, 21 pages.
Chu et al., "Performance Specifications for Proton Medical Facility" , Lawrence Berkeley Laboratory, University of California, Mar. 1993, 128 pages.
Chu, "Instrumentation in Medical Systems" Accelerator and Fusion Research Division, Lawrence Berkeley Laboratory, University of California, Berkeley, CA, May 1995, 9 pages.

Tilly et al., "Development and verification of the pulsed scanned proton beam at the Svedberg Laboratory in Uppsala", Phys. Med. Biol. 52, 2007, pp. 2741-2754.
Bimbot, "First Studies of the Extern-al Beam from the Orsay S.C. 200 MeV" Institut de Physique Nucleaire, BP 1, Orsay, France, IEEE, 1979, pp. 1923-1926.
Cosgrove et al., "Microdosimetric Studies on the Orsay Proton Synchrocyclotron at 73 and 200 MeV", Radiation Protection Dosimetry, vol. 70, Nos. 1-4, pp. 493-496, 1997.
Laisne et al., "The Orsay 200 MeV Synchrocyclotron" IEEE Transactions on Nuclear Science, vol. NS-26, No. 2, Apr. 1979, pp. 1919-1922.
First Office action issued by Chinese Patent Office for Appln. 200880125832.9 dated Sep. 22, 2011.
Timmer, Jan, "The ACCEL Single Room Proton Therapy Facility" ACCEL Instruments GmbH, PTCOG 45, Oct. 7-11, 2006, Houston, Texas (18 pages).
Renner, T.R., et al., "Preliminary Results of a Raster Scanning Beam Delivery System", IEEE, 1989 (3 pages).
Pardo, J., et al., "Simulation of the Performance of the CNAO facility's Beam Delivery System", PTCOG 46, Zibo, China, May 21, 2007 (17 pages).
"Single Room Proton Therapy Facility", ACCEL, Oct. 2006 (1 page).
Flanz, J, et al., "Scanning Beam Technologies", PTCOG 2008 (28 pages).
Lin, S., et al., "Principles and 10 Year Experience of the Beam Monitor System at the PSI Scanned Proton Therapy Facility", Center for Proton Radiation Therapy, Paul Scherrer Institute, CH-5232 Villigen PSI, Switzerland, 2007 (21 pages).
Chinese Office Action with English translation from corresponding Chinese Application 200880125832.9 issued Sep. 29, 2013 (11 pages).
Office Action with English translation from Taiwanese application No. 097144546 issued Oct. 25, 2013 (27 pages).
Chu, W.T., et al., "Instrumentation for treatment of cancer using proton and light-ion beams", Lawrence Berkeley Laboratory, University of California, Berkeley California 94720, Review of Scientific Instruments 64(1993) August, No. 8, Woodbury, NY, US, Received Jan. 14, 1993, accepted for publication May 24, 1993 (68 pages).
Office Action from U.S. Appl. No. 13/618,939 dated Mar. 11, 2013 (6 pages).
Response with English translation to Japanese Office filed Mar. 1, 2012 in Japanese Application No. 2007-522777 (14 pages).
Voluntary amendment filed in Canadian Application No. 2,574,122 on Jul. 26, 2010 (16 pages).
Tilly, et al., "Development and verification of the pulsed scanned proton beam at The Svedberg Laboratory in Uppsala", Physics in Medicine and Biology, Phys. Med. Biol. 52, pp. 2741-2454, 2007.
European Search Report issued in European Application No. 08856764.9 on Jun. 4, 2014 (3 pages).
Voluntary amendment filed in Canadian Application No. 2707075 on Oct. 18, 2013 (8 pages).
Response with English translation to office action dated Oct. 25, 2013 in Taiwanese Application No. 097144546, filed on Mar. 28, 2014 (34 pages).
Response with English translation to Japanese Office action filed Mar. 1, 2012 in Japanese Application No. 2007-522777 (14 pages).
Office action with English translation from Japanese Application No. 2007-522777 mailed Oct. 4, 2011 (15 pages).
European search report from European Application No. 10175751.6 mailed Nov. 18, 2010 (8 pages).
Response to examination search report filed in European Application No. 05776532.3 on Dec. 20, 2011 (14 pages).
European communication issued in European Application No. 05776532.3 mailed Jun. 10, 2011 (10 pages).
Office action with English translation issued in Chinese Application No. 201010581384.2 on Nov. 10, 2011 (19 pages).
Volunatary amendment filed in Canadian Application No. 2,574,122 on Jul. 26, 2010 (16 pages).

(56) References Cited

OTHER PUBLICATIONS

Voluntary amendment filed in Canadian Application No. 2,574,122 on Nov. 5, 2010 (15 pages).

Response with English translation to Chinese Office action filed in Chinese Application No. 200880125832.9 on Dec. 16, 2013 (12 pages).

European Search Report from corresponding European application No. 088556764.9 mailed Jun. 5, 2014 (3 pages).

European Search Report from corresponding European Application No. 08856764.9 mailed Jul. 31, 2014 (11 pages).

Lin et al., "Principles and 10 Year Experience of the Beam Monitor System at the PSI Scanned Proton Therapy Facility", Center for Proton Radiation Therapy, Paul Scherrer Institute, CH-5232, Villigen PSI, Switzerland, 2007, 21 pages.

Canadian Office Action from Canadian application 2574122 issued Aug. 14, 2014 (6 pages).

* cited by examiner

MATCHING A RESONANT FREQUENCY OF A RESONANT CAVITY TO A FREQUENCY OF AN INPUT VOLTAGE

TECHNICAL FIELD

This patent application describes matching a resonant frequency of a resonant cavity to a frequency of a voltage input to the resonant cavity.

BACKGROUND

In order to accelerate charged particles to high energies, many types of particle accelerators have been developed. One type of particle accelerator is a cyclotron. A cyclotron accelerates charged particles in an axial magnetic field by applying an alternating voltage to one or more dees in a vacuum chamber. The name dee is descriptive of the shape of the electrodes in early cyclotrons, although they may not resemble the letter D in some cyclotrons. The spiral path produced by the accelerating particles is normal to the magnetic field. As the particles spiral out, an accelerating electric field is applied at the gap between the dees. The radio frequency (RF) voltage creates an alternating electric field across the gap between the dees. The RF voltage, and thus the field, is synchronized to the orbital period of the charged particles in the magnetic field so that the particles are accelerated by the radio frequency waveform as they repeatedly cross the gap. The energy of the particles increases to an energy level in excess of the peak voltage of the applied RF voltage. As the charged particles accelerate, their masses grow due to relativistic effects. Consequently, the acceleration of the particles becomes non-uniform and the particles arrive at the gap asynchronously with the peaks of the applied voltage.

Two types of cyclotrons presently employed, an isochronous cyclotron and a synchrocyclotron, overcome the challenge of increase in relativistic mass of the accelerated particles in different ways. The isochronous cyclotron uses a constant frequency of the voltage with a magnetic field that increases with radius to maintain proper acceleration. The synchrocyclotron uses a decreasing magnetic field with increasing radius and varies the frequency of the accelerating voltage to match the mass increase caused by the relativistic velocity of the charged particles.

SUMMARY

Described herein is synchrocyclotron comprising: magnetic yokes that define a resonant cavity, a source to provide input voltage to the resonant cavity, and feedback circuitry to control the source so that a frequency of the input voltage substantially matches a resonant frequency of the resonant cavity. The synchrocyclotron may also include one or more of the following features, either alone or in combination.

The source may comprise a voltage controlled oscillator (VCO). The feedback circuitry may comprise a phase detector to detect a phase difference between the frequency of the input voltage and the resonant frequency. The VCO may be configured to change the frequency of the input voltage when the phase difference deviates from a predetermined value. The phase detector may be configured to detect the phase difference by comparing the frequency of the input voltage to a resonant frequency of a voltage or a current in the resonant cavity.

The synchrocyclotron may comprise circuitry to present the phase detector with substantially constant frequencies over a swept frequency range. The substantially constant frequencies may be derived from a frequency of the input voltage and the resonant frequency. The resonant frequency may sweep between about 30 megahertz (MHz) and 300 MHz (VHF) over time, e.g., over about 1 millisecond (ms). In one example, the frequency may sweep between 95 MHz and about 135 MHz in about 1 ms.

The synchrocyclotron may comprise an integrator to receive an output of the phase detector, and a filter to generate a control signal for the VCO based on the output of the phase detector. The control signal may be for causing the VCO to change the frequency of the input voltage when the phase difference deviates from the predetermined value. The filter may comprise a low-pass filter having a cutoff frequency that is inversely proportional to a sweep time of the resonant frequency.

The synchrocyclotron may comprise a tuning circuit to change the resonant frequency of the resonant cavity. The tuning circuit may comprise a variable capacitive circuit that is rotatable and/or a variable inductive circuit. The synchrocyclotron may comprise an ion source to provide particles to the resonant cavity. The input voltage may comprise a radio frequency (RF) voltage to draw particles from the resonant cavity. A combination of the RF voltage and a magnetic field caused by the magnetic yokes may cause particles drawn from the resonant cavity to accelerate.

Also described herein is an apparatus comprising magnetic structures that define a resonant cavity, a source to provide particles to the resonant cavity, a voltage source to provide radio frequency (RF) voltage to the resonant cavity, a phase detector to detect a difference in phase between the RF voltage and a resonant frequency of the resonant cavity that changes over time, and a control circuit, responsive to the difference in phase, to control the voltage source so that a frequency of the RF voltage substantially matches the resonant frequency of the resonant cavity. The apparatus may also include one or more of the following features, either alone or in combination.

The control circuit may comprise an integrator to generate a current control signal in response to the phase difference and a low-pass filter to generate, in response to the current signal, a voltage control signal for the voltage source.

The resonant cavity may comprise a first dee to receive the RF voltage and a second dee that is electrically connected to ground. A space between the first dee and the second dee forms a gap. The first dee and the second dee define a tunable resonant circuit configured to create an oscillating electric field across the gap in response to the RF voltage. A voltage/current pickup element may be associated with the resonant cavity, which may be used for obtaining the instantaneous frequency of the resonant cavity and for providing a voltage/current sample to the phase detector.

Also described herein is circuitry to substantially match a resonant frequency of a resonant cavity to a frequency of an input voltage to the resonant cavity. The resonant frequency changes over time. The circuitry comprises a phase detector to detect a difference in phase between the resonant frequency and the input voltage. The phase detector is for outputting a first signal that corresponds to the difference. An integrator and filter circuit are configured to generate a control signal in response to the first signal. A voltage controlled oscillator is configured to regulate the input voltage in response to the control signal. The circuitry may also include one or more of the following features, either alone or in combination.

The phase detector may be configured to obtain the resonance frequency from a voltage of the resonant cavity or from a current of the resonant cavity. The resonant frequency may sweep over a frequency range of about 30 MHz and 300 MHz in a predefined time. In one example, the sweep may be between about 95 MHz and about 135 MHz. The integrator and filter circuit may comprise a low-pass filter having a cutoff frequency that is inversely proportional to the predefined time. The resonant cavity may be part of a synchrocyclotron that is configured to accelerate protons from the resonant cavity.

The circuitry may comprise a pickup element associated with the resonant cavity. The pickup element may be for obtaining a signal corresponding to the resonant frequency. The phase detector may be for receiving the signal from the pickup element. The pickup element may be capacitive and the signal may comprise a voltage signal. The pickup element may be inductive and the signal may comprise a current signal.

Also described herein is a method of matching a resonant frequency of a resonant cavity to a frequency of an input voltage to the resonant cavity, where the resonant frequency changes over time. The method comprises detecting a difference in phase between the resonant frequency and the input voltage, where a first signal corresponds to the difference, generating a control signal in response to the first signal, and regulating the input voltage in response to the control signal. The method may also include one or more of the following features, either alone or in combination.

Detecting the difference in phase may comprise obtaining the resonance frequency from one of a voltage of the resonant cavity and a current of the resonant cavity. The resonant frequency may sweep over a frequency range of about 30 MHz and about 300 MHz in about a predefined time. The control signal may be a low-pass filter circuit that has a cutoff frequency that is inversely proportional to the predefined time. The resonant cavity may be part of a synchrocyclotron that is configured to accelerate protons from the resonant cavity.

The method may comprise obtaining a signal corresponding to the resonant frequency. The difference in phase between the resonant frequency and the input voltage may be determined based on the signal corresponding to the resonant frequency.

The foregoing are not limited to use with a synchrocyclotron, but rather may be used with any type of cyclotron.

Any one or more of the foregoing features may be combined.

The details of one or more examples are set forth in the accompanying drawings and the description below. Further features, aspects, and advantages will become apparent from the description, the drawings, and the claims.

DETAILED DESCRIPTION

A synchrocyclotron-based system is described herein. However, the circuits and methods described herein may used with any type of cyclotron.

Figure 1A:
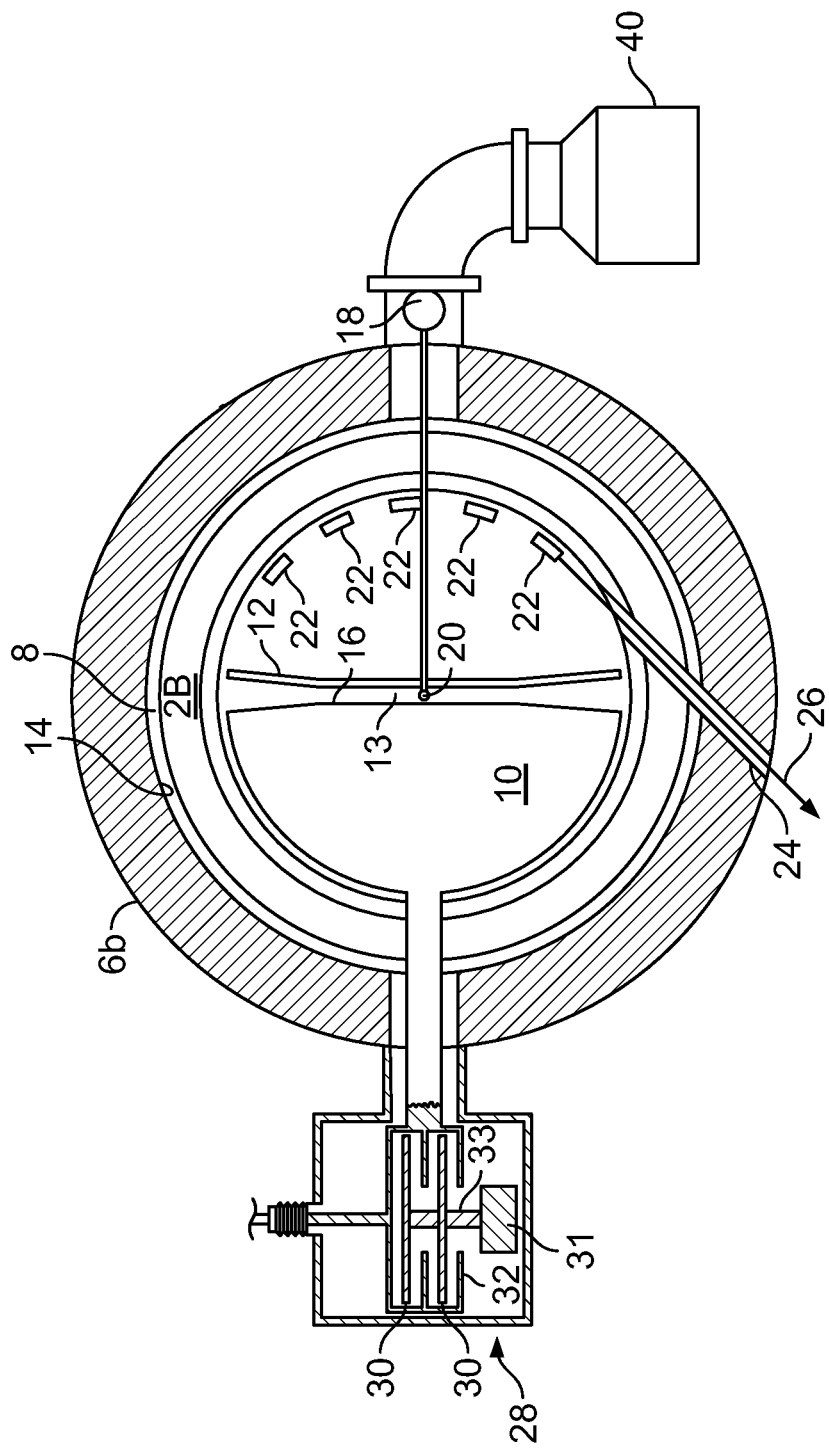
FIG. 1A is a cross-sectional view of a synchrocyclotron.
Figure 1B:
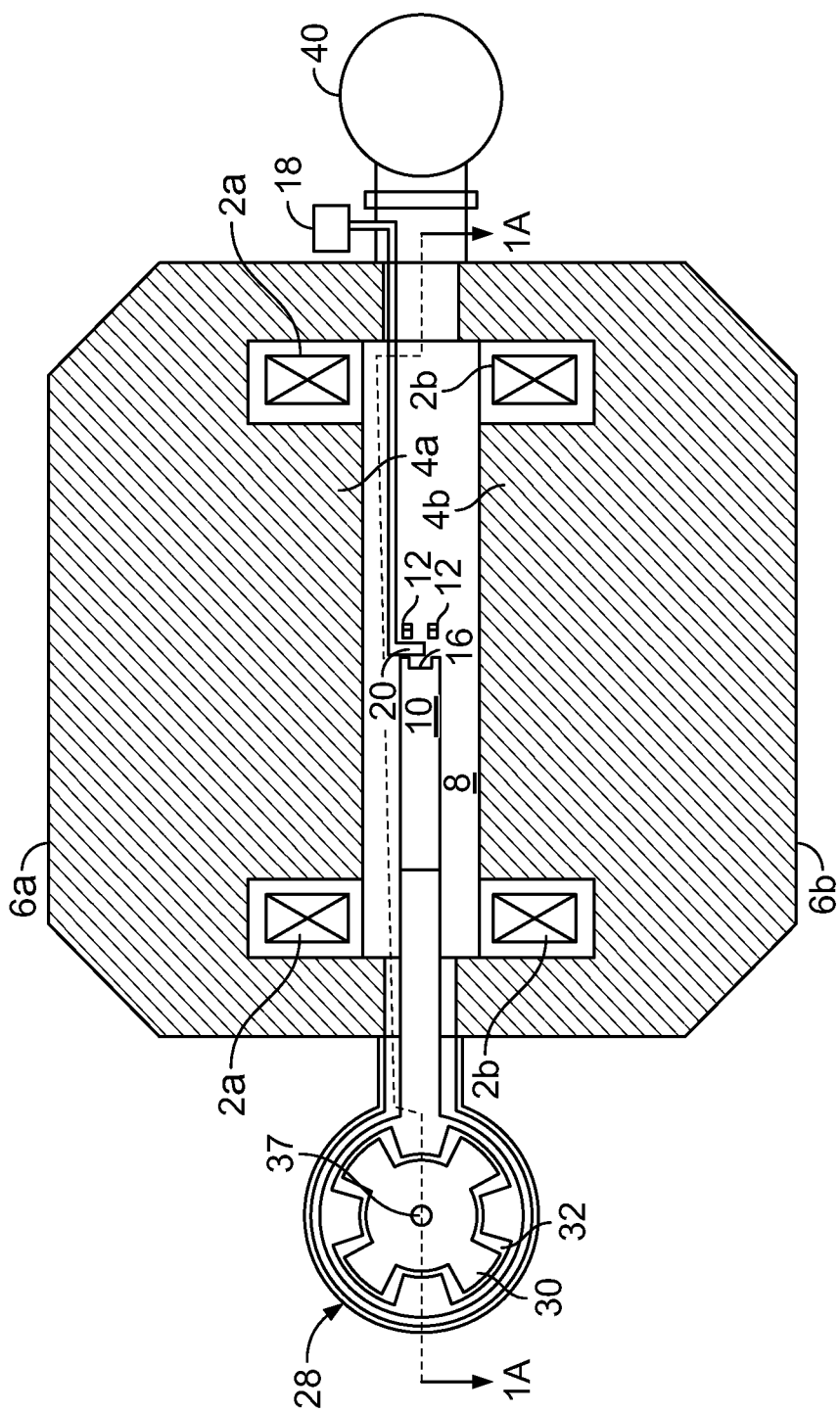
FIG. 1B is a side cross-sectional view of the synchrocyclotron shown in FIG. 1A.

Referring to FIGS. 1A and 1B, a synchrocyclotron includes electrical coils $2a$ and $2b$ around two spaced apart metal magnetic poles $4a$ and $4b$, which are configured to generate a magnetic field. Magnetic poles $4a$ and $4b$ are defined by two opposing portions of yokes $6a$ and $6b$ (shown in cross-section). The space between poles $4a$ and $4b$ defines vacuum chamber 8 or a separate vacuum chamber can be installed between poles $4a$ and $4b$. The magnetic field strength is generally a function of distance from the center of vacuum chamber 8 and is determined largely by the choice of geometry of coils $2a$ and $2b$ and the shape and material of magnetic poles $4a$ and $4b$.

The accelerating electrodes are defined as dee 10 and dee 12, having gap 13 between them. Dee 10 is connected to an alternating voltage potential whose frequency is changed from high to low during an accelerating cycle in order to account for the increasing relativistic mass of a charged particle and radially decreasing magnetic field (measured from the center of vacuum chamber 8) produced by coils $2a$ and $2b$ and pole portions $4a$ and $4b$. The characteristic profile of the alternating voltage in dees 10 and 12 is show in FIG. 2 and will be discussed in detail below. In this example, dee 10 is a half-cylinder structure, which is hollow inside. Dee 12, also referred to as the "dummy dee", does not need to be a hollow cylindrical structure, since it is grounded at the vacuum chamber walls 14. Dee 12, as shown in FIGS. 1A and 1B, includes a strip of metal, e.g., copper, having a slot shaped to match a substantially similar slot in dee 10. Dee 12 can be shaped to form a mirror image of surface 16 of dee 10.

Ion source 18, which includes ion source electrode 20, is located at the center of vacuum chamber 8, and is operated to provide charged particles. Extraction electrodes 22 direct the charge particles into extraction channel 24, thereby forming beam 26 of the charged particles. The ion source may also be mounted externally and provide the ions substantially axially into the acceleration region. The ion source may be of the type described in U.S. patent application Ser. No. 11/948,662, entitled "Interrupted Particle Source", the contents of which are incorporated herein by reference as if set forth in full.

Dees 10 and 12 and other pieces of hardware included in a synchrocyclotron define a tunable resonant circuit under an oscillating voltage input that creates an oscillating electric field across gap 13. The result is a resonant cavity in vacuum chamber 8. This resonant frequency of the resonant cavity can be tuned to keep its Q-factor high during a frequency sweep by using a tuning mechanism. In one example, the resonant frequency of the resonant cavity moves, or "sweeps", between about 30 megahertz (MHz) and about 300 MHz (traditional VHF) in about 1 millisecond (ms). In another example, the resonant frequency of the resonant cavity moves, or "sweeps", between about 95 MHz and about 135 MHz in about 1 millisecond (ms).

The Q-factor is a measure of the "quality" of a resonant system in its response to frequencies close to the resonant frequency. In this example, the Q-factor is defined as $$Q = 1/R \times \sqrt{(L/C)},$$

where R is the active resistance of the resonant circuit, L is the inductance, and C is the capacitance of the resonant circuit.

The tuning mechanism can be, e.g., a variable inductance coil or a variable capacitance. A variable capacitance device can be a vibrating reed or a rotating capacitor. In the example shown in FIGS. 1A and 1B, the tuning mechanism includes rotating capacitor 28. Rotating capacitor 28 includes rotating blades 30 that are driven by a motor 31. During each quarter cycle of motor 31, as blades 30 mesh with blades 32, the capacitance of the resonant circuit that includes dees 10 and 12 and rotating capacitor 28 increases and the resonant frequency decreases. The process reverses as the blades unmesh. Thus, the resonant frequency is changed by changing the capacitance of the resonant circuit. This serves the purpose of reducing, by a large factor, the power required to generate the high voltage applied to the dees and necessary to accelerate the particle beam. The shape of blades 30 and 32 can be machined so as to create the required dependence of resonant frequency on time.

The blade rotation can be synchronized with RF frequency generation so that, by varying the Q-factor of the resonant cavity, the resonant frequency of the resonant circuit defined by the synchrocyclotron is kept close to the frequency of the alternating voltage potential applied to the resonant cavity.

A vacuum pumping system 40 maintains vacuum chamber 8 at a very low pressure so as not to scatter the accelerating beam.

To achieve uniform acceleration in the synchrocyclotron, the frequency and the amplitude of the electric field across the dee gap is varied to account for the relativistic mass increase and radial variation of magnetic field as well as to maintain focus of the beam of particles. The radial variation of the magnetic field is measured as a distance from the center of a spiral trajectory of a charged particle.

Figure 2:
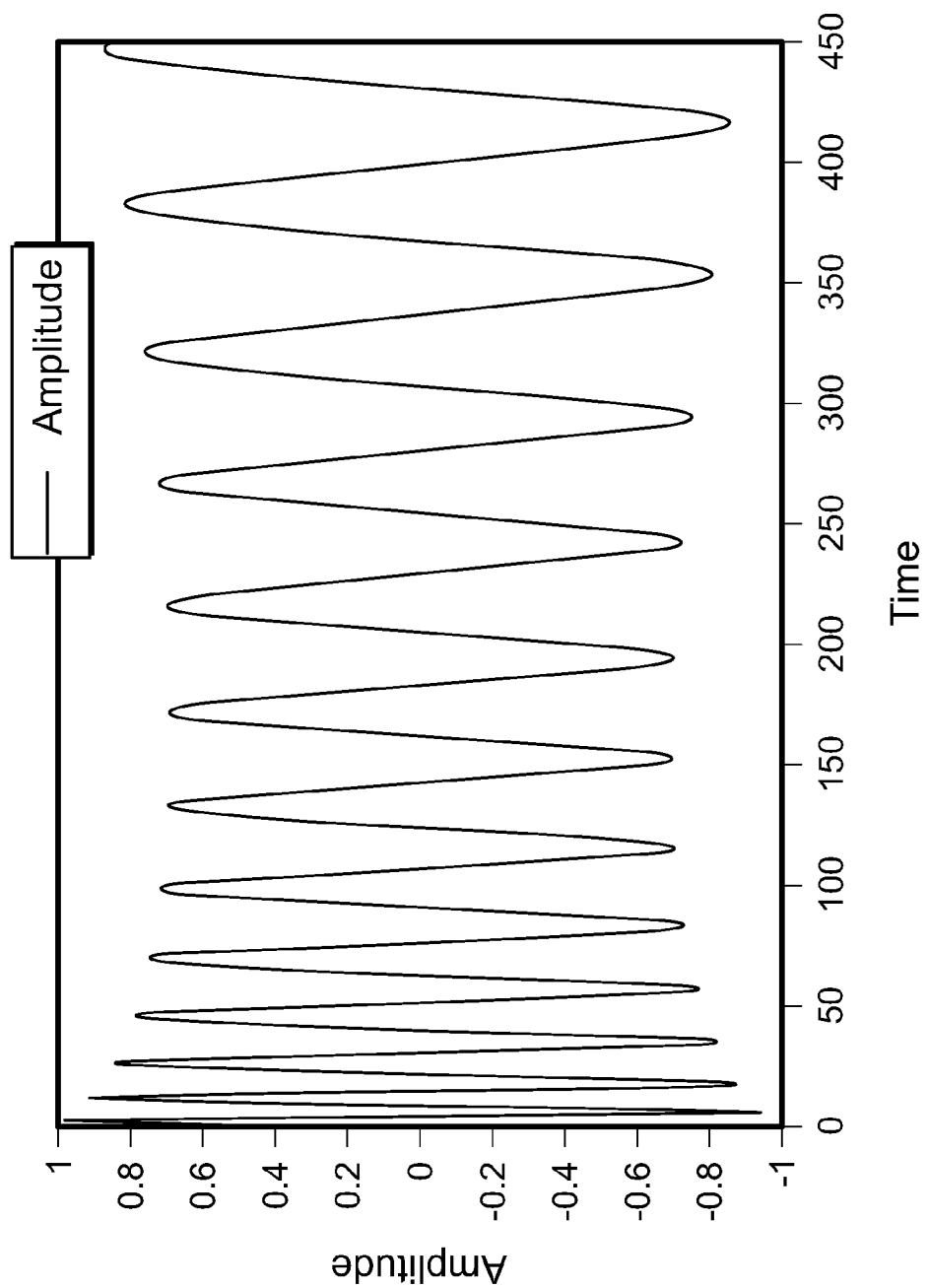
FIG. 2 is an illustration of an idealized waveform that can be used for accelerating charged particles in the synchrocyclotron of FIGS. 1A and 1B.

FIG. 2 is an illustration of an idealized waveform that may be required for accelerating charged particles in a synchrocyclotron. It shows only a few cycles of the waveform and does not necessarily represent the ideal frequency and amplitude modulation profiles. FIG. 2 illustrates the time varying amplitude and frequency properties of the waveform used in the synchrocyclotron. The frequency changes from high to low as the relativistic mass of the particle increases while the particle speed approaches a significant fraction of the speed of light.

In a synchrocyclotron particle accelerator, as particle gain energy, their frequencies changes relatively quickly over time. To change the resonant frequency of the synchrocyclotron accordingly, the capacitive and/or inductive properties of the synchrocyclotron are varied mechanically, as described above (e.g., using a rotating capacitor 31). In order to generate a voltage across the dee gap that ensures that particles gain enough energy to accelerate to full speed as the resonant frequency changes, power should be delivered to the resonant cavity over an entire particle beam acceleration period. To achieve the required voltage using a low amount of power, the frequency of the input (or applied) RF voltage should match the resonant frequency of the resonant cavity.

A digital phase-lock-loop topology may be employed in the synchrocyclotron to substantially match the frequency of the input RF voltage to the resonant frequency of the resonant cavity. In this context, a substantial match includes an exact match or a match that is close enough to obtain similar benefits of an exact match.

As explained above, the resonant frequency of the resonant cavity may change over a broad range at a relatively high rate of speed; in one example, the resonant frequency may sweep 40 MHz in 1 ms. The control system used in the example phase-lock-loop topology includes a closed loop feedback circuit to detect a phase difference between the frequency of the input RF voltage and the resonant frequency of the resonant cavity, to generate an error signal proportional to the phase difference, and to drive a broadband voltage controlled oscillator (VCO) to adjust the frequency of the input RF voltage in order to maintain resonance. One advantage of using the phase-lock-loop described herein for this purpose is that the circuitry used in its implementation can be located far enough away from the synchrocyclotron's beam chamber to be out of its radiation field.

Figure 3:
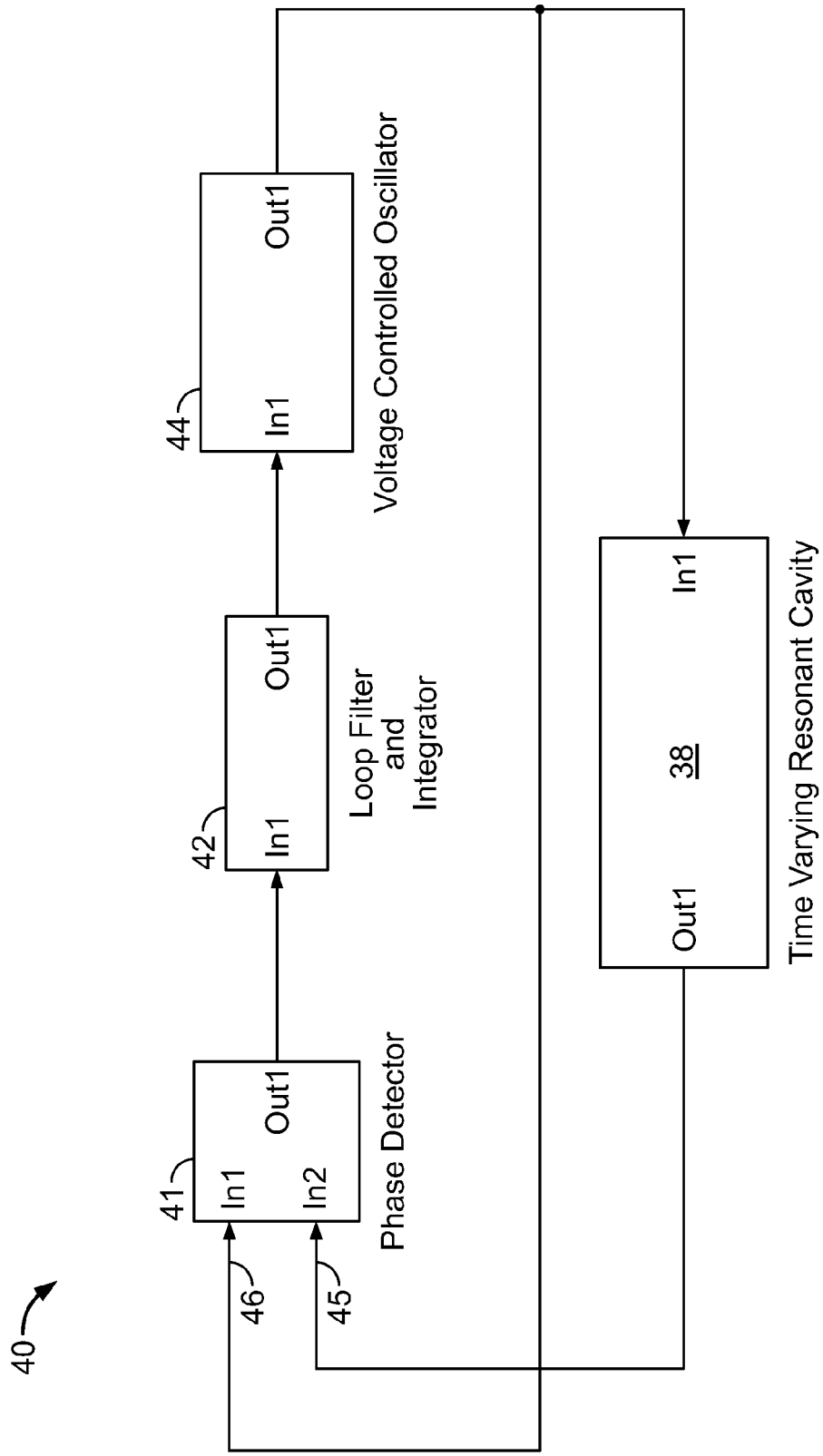
FIG. 3 is a block diagram of a control circuit that may be used in the synchrocyclotron of FIGS. 1A and 1B.

FIG. 3 shows an example of a control system 40 that may be used to match the frequency of the input RF voltage to the resonant frequency of a resonant cavity 38 (in vacuum chamber 8) in the synchrocyclotron of FIGS. 1A and 1B. Control system 40 includes a phase detector 41, an integrating current-to-voltage conversion loop filter 42, and a VCO 44.

Phase detector 41 may be any type of phase detection circuit that is capable of identifying a phase difference between the frequencies of two input signals. Phase detector 41 is implemented in hardware in this example; however, in other examples, the phase detector may be implemented using software. The input signals may include any combination of signals, such as two voltage signals or a voltage signal and a current signal. The output of phase detector 41 is a signal that corresponds to the detected phase difference. In this example, the output of phase detector 41 is a current pulse having a length that corresponds to the detected phase difference.

Integrating current-to-voltage conversion loop filter 42 includes an integrator to sum the current pulses from phase detector 41 over time, and a loop filter to generate a voltage control signal for VCO 44 from the integrated current pulses. A transfer function of the loop filter is an impedance since integrating current-to-voltage conversion loop filter 42 transforms the switched current of the phase detector to a voltage for the VCO. In one example, the transfer function may be $$\frac{V_{out}}{I_{in}} = -\frac{R_1 C_1 s + 1}{s C_1},$$

where $R_1$ and $C_1$ are resistive and capacitive values of the loop filter.

The bandwidth of the loop filter is set by a combination of $R_1$ and $C_1$, and may have a value that is about ⅓ of a modulation limit of the VCO. This value may be set to give VCO 44 enough time to respond to an input control signal in order to maintain loop stability. Furthermore, the output of the integrating current-to-voltage conversion loop filter 42 may be low-pass filtered, e.g., to remove high-frequency noise. The low-pass filter may be a resistive-capacitive (RC) circuit that is part of, or separate from, integrating current-to-voltage conversion loop filter 42. A cutoff frequency of the low-pass filter may be based on a sweep time ($\tau_{sweep}$) of the resonant frequency of the resonant cavity. The sweep time refers to the time it takes for the resonant frequency to move, or "sweep" through all possible frequencies, e.g., between 95 MHz and 135 MHz. The cutoff frequency of the low-pass filter may be defined by the following equation $$\frac{1}{1.1 * 2 * \tau_{sweep}}.$$

Figure 4:
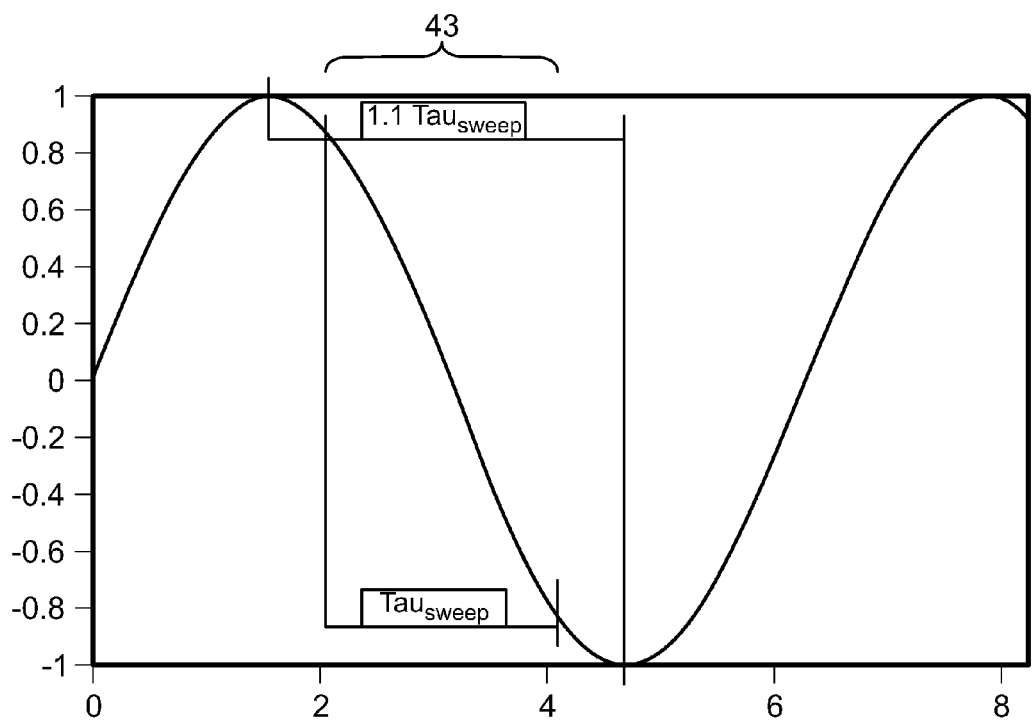
FIG. 4 is a graph showing a frequency sweep of a resonant frequency in a resonant cavity of the synchrocyclotron.

The foregoing configuration enables control circuitry 40 to follow a frequency sweep that is approximately linear over a specified sweep time, $\tau_{sweep}$ 43 of FIG. 4, while reducing unwanted oscillations in a steady-state response.

VCO 44 is an electronic oscillator that is controlled by an input voltage signal to oscillate at a particular frequency. In this case, the input voltage signal is the output voltage of integrating current-to-voltage conversion loop filter 42. The output voltage of VCO 44 is applied to the resonant cavity (e.g., to dee 10), as shown in FIG. 3. The output voltage of VCO 44 is also applied an input to phase detector 41.

During operation of control system 40, a pickup element in the resonant cavity obtains a signal that corresponds to a resonant frequency of the resonant cavity. Since, at resonance, voltage and current are in phase, the signal may be either a voltage signal or a current signal. A capacitive circuit in the resonant cavity may be used to obtain the voltage signal. An inductive circuit in the resonant cavity may be used to obtain the current signal. In this implementation, there is little current in the resonant cavity; accordingly, a capacitive circuit (e.g., one or more capacitors) obtains a voltage signal.

Figure 5:
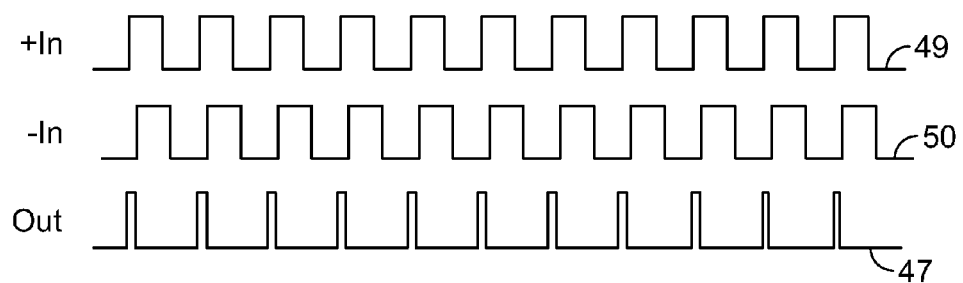
FIG. 5 includes timing diagrams showing an output of a phase detector used in the control circuit of FIG. 3 in response to two inputs.

The voltage signal is applied to an input 45 of phase detector 41. The other input 46 of phase detector 41 receives the output of VCO 44 (i.e., the input RF voltage to the resonant cavity). The signals have a phase difference of 0°, and thus are in phase, if the frequency of the VCO output matches the (time-varying) resonant frequency of the resonant cavity. If the two do not match, or come within a predefined tolerance defined, e.g., by phase detector 41, phase detector 41 outputs a current pulse. The current pulse has a width that is proportional to the phase difference detected by the phase detector, and is signed to indicate whether the VCO output (input 46) leads or lags the resonant frequency (input 45). An example output 47 of phase detector 41, in response to inputs 49 and 50, is shown in FIG. 5.

Integrating current-to-voltage conversion loop filter 42 includes an integrator that receives the output current pulses of phase detector 41, and that sums the output current pulses over time. The resulting sum is applied to an internal loop filter, which generates a voltage control signal for VCO 44. The voltage control signal is low-pass filtered to remove, e.g., high-frequency noise components, and applied to VCO 44. VCO 44 is generates an output RF voltage to substantially compensate for the difference between the prior input voltage frequency and the prior resonant cavity frequency. For example, the greater the phase difference, the larger the output RF voltage of VCO 44 may be. The output of VCO 44 is provided to the resonant cavity, e.g., to dee 10, and to input 45 of phase detector 41. The foregoing process repeats for the new input voltage and resonant cavity frequencies.

In one implementation, the open loop transfer function of control system 40 is as follows:

$$G = -\frac{k_d * k_v * \omega_v R_1 C_1 s + k_d k_v \omega_v}{R_2 C_1 C_2 s^4 + (C_1 + R_1 C_1 C_2 \omega_v) s^3 + C_1 \omega_v s^2},$$

where $k_d$ is a current gain of a phase locked loop (PLL) chip used to implement the phase detector, $k_v$ is a gain of the VCO, $\omega_v$ is a modulation frequency limit of the VCO, $R_1$ and $C_1$ are resistive and capacitive elements of the integrator and $R_2$ and $C_2$ are resistive and capacitive element of the low-pass filter.

The control system described herein is not limited to use with the synchrocyclotron of FIGS. 1A and 1B or even to synchrocyclotrons in general, but rather may be used in any type of cyclotron in which the resonant frequency of the resonant cavity has a relatively high slew rate, e.g., a frequency that sweeps on the order of tens of megahertz in about one or several milliseconds.

Furthermore, the control system described herein is not limited to the specific configuration shown in FIG. 3. Rather, any circuitry that implements the same, or similar functions, may be used to implement the control system.

Figure 6:
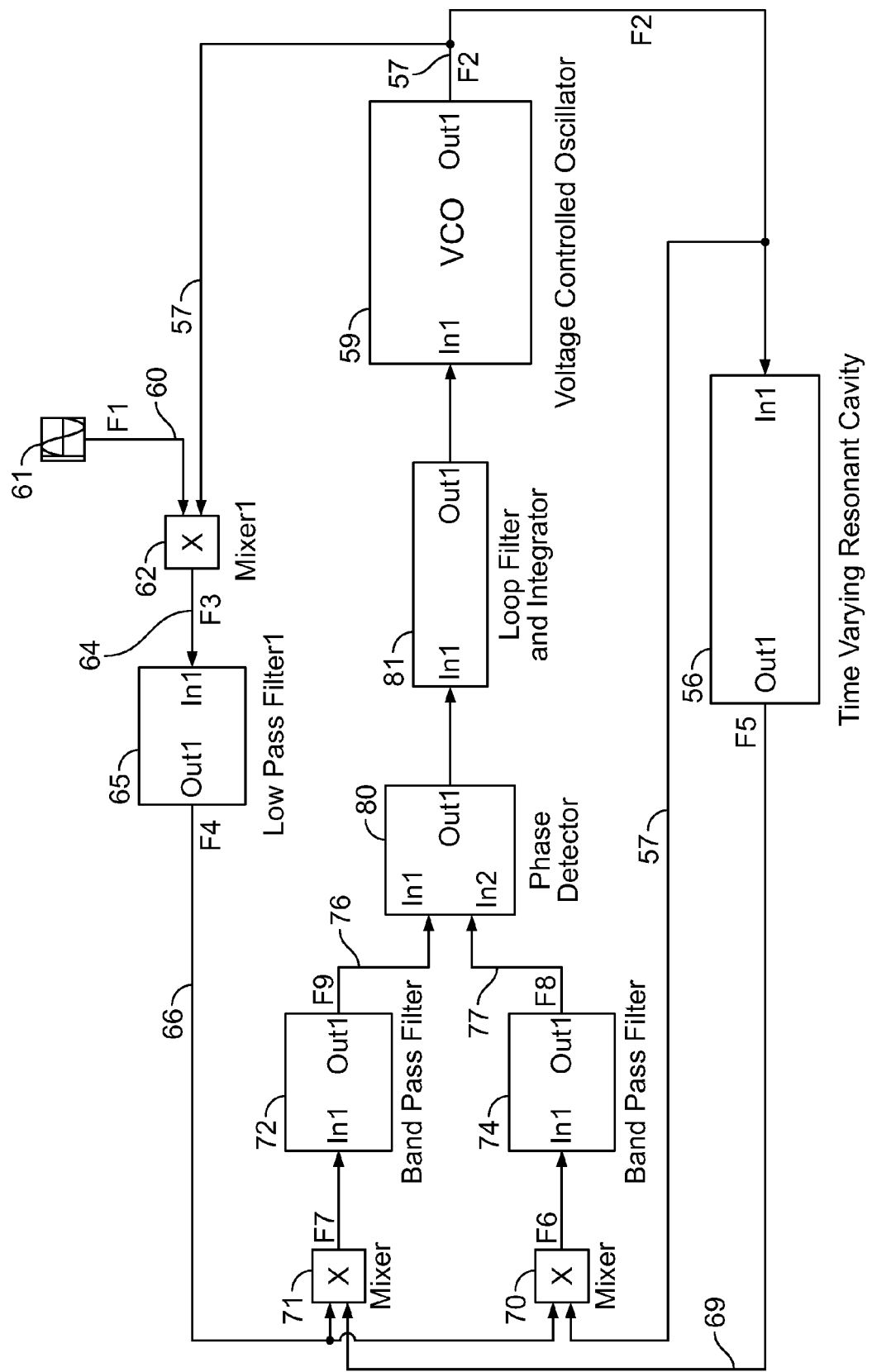
FIG. 6 is a block diagram of an alternative control circuit that may be used in the synchrocyclotron of FIGS. 1A and 1B.

FIG. 6 shows another example of a control system 55 that may be implemented in a cyclotron, such as the synchrocyclotron of FIGS. 1A and 1B. The example of FIG. 6 uses mixing circuits (referred to herein as "mixers") to present the phase detector with substantially constant frequencies over substantially the entire frequency range that the resonant cavity 56 is swept (in one example, between about 95 megahertz (MHz) and about 135 MHz in about 1 millisecond (ms)).

In FIG. 6, the output 57 ($f_2$) of voltage controlled oscillator (VCO) 59, which is applied to resonant cavity 56, is also mixed with a substantially constant frequency 60 ($f_1$), which may be applied by signal generating circuit 61. In this example, mixer 62 acts as a sine wave multiplier. Multiplying the two sine waves $f_1$ and $f_2$, as follows $$f_1 = A\sin(\omega_1 t + \theta_1) \text{ and } f_2 = B\sin(\omega_2 t + \theta_2)$$

produces a signal 64 ($f_3$) comprised of the sum of, and the difference of, the two original signal frequencies $f_1$, $f_2$, as follows:

$$f_3 = f_1 f_2 = \frac{AB}{2}(\cos((\omega_1 - \omega_2)t + \phi_1) - \cos((\omega_1 + \omega_2)t + \phi_2)),$$

where $\phi_1 = \theta_1 - \theta_2$ and $\phi_2 = \theta_1 + \theta_2$. The signal $f_3$ is low-pass filtered via low-pass filter 65 to produce filtered signal $f_4$, as follows:

$$f_4 = \frac{AB}{2}\cos((\omega_1 - \omega_2)t + \phi_1)$$

Since the output of VCO 59 is a frequency that varies over time, the resonant frequency, $\omega_2$, of resonant cavity 56 varies over time and also the output of mixer 62 varies over time. The output of resonant cavity, $f_5$, is as follows:

$$f_5 = C\sin(\omega_2 t + \theta_3)$$

The filtered signal $f_4$ 66 is mixed with the cavity input, $f_2$ 57, and the resonant cavity output, $f_5$ 69 via mixers 70 and 71, respectively, to produce two signals, $f_6$, $f_7$, as follows:

$$f_6 = f_2 f_4$$
$$= \frac{AB^2}{4}(\cos((2*\omega_2 - \omega_1)t + \theta_2 - \phi_1 - 90) - \cos(\omega_1 t + \theta_2 + \phi_1 + 90))$$

and $$f_7 = f_4 f_5$$
$$= \frac{ABC}{4}(\cos((\omega_1 - 2\omega_2)t - \theta_3 + \phi_1 + 90) - \cos(\omega_1 t + \theta_3 + \phi_1 + 90)).$$

Band-pass filters 70 and 71 band-pass filter signals $f_6$ and $f_7$, respectively, at a center frequency of $\omega_1$ to produce signals $f_8$ 76, and $f_9$ 77 as follows:

$$f_8 = -\frac{AB^2}{4}\cos(\omega_1 t + \theta_2 + \phi_1 + 90))$$

and $$f_9 = -\frac{ABC}{4}\cos(\omega_1 t + \theta_3 + \phi_1 + 90)).$$

In this example, to perform frequency tracking, phase detector 80 determines the phase difference between the resonant cavity input 57 and the resonant cavity output 69 and drives this difference to about zero. The difference, θ, in the phase components of signals $f_5$ and $f_6$ is as follows:

$$\Theta = (\theta_2 + \phi_1 + 90) - (\theta_3 + \phi_1 + 90) = \theta_2 - \theta_3.$$

This is the phase difference between the input 57 and the output 69 of the resonant cavity 56. In this case, the frequency of the input signals to phase detector 80 are substantially constant at a frequency $\omega_1$ regardless of the output frequency, $\omega_2$, for any time, t. The output of phase detector 80 is passed into loop filter 81 and processed in the same way as is described with respect to FIG. 3.

Components of different implementations described herein may be combined to form other embodiments not specifically set forth above. Other implementations not specifically described herein are also within the scope of the following claims.

What is claimed is:

1. A synchrocyclotron comprising:
magnetic yokes that define a resonant cavity;
a source to provide input voltage to the resonant cavity, the source comprising a voltage controlled oscillator (VCO); and
feedback circuitry to control the source so that a frequency of the input voltage substantially matches a resonant frequency of the resonant cavity, the feedback circuitry comprising:
a phase detector to detect a phase difference between the frequency of the input voltage and the resonant frequency;
an integrator to receive an output of the phase detector and to sum the output over time
a filter to generate a control signal for the VCO based on an output of the integrator, the control signal for causing the VCO to change the frequency of the input voltage in accordance with the phase difference, and
circuitry to present the phase detector with substantially constant frequencies over at least part of a frequency range that the resonant cavity is swept.

2. The synchrocyclotron of claim 1, wherein the substantially constant frequencies are derived from a frequency of the input voltage and the resonant frequency.

3. The synchrocyclotron of claim 1, wherein the filter comprises a low-pass filter having a cutoff frequency that is inversely proportional to a sweep time of the resonant frequency.

4. The synchrocyclotron of claim 1, wherein the phase detector is configured to detect the phase difference by comparing the frequency of the input voltage to a resonant frequency of a voltage in the resonant cavity.

5. The synchrocyclotron of claim 1, wherein the phase detector is configured to detect the phase difference by comparing the frequency of the input voltage to a resonant frequency of a current in the resonant cavity.

6. The synchrocyclotron of claim 1, further comprising:
an ion source to provide particles to the resonant cavity,
wherein the input voltage comprises a radio frequency (RF) voltage to draw particles from the resonant cavity; and
wherein a combination of the RF voltage and a magnetic field caused by the magnetic yokes causes particles drawn from the resonant cavity to accelerate.

7. The synchrocyclotron of claim 1, wherein the resonant frequency sweeps between about 30 megahertz (MHz) and about 300 MHz in about 1 millisecond (ms).

8. The synchrocyclotron of claim 7, further comprising:
a tuning circuit to change the resonant frequency of the resonant cavity,
wherein the tuning circuit comprises:
a variable capacitive circuit that is rotatable; or
a variable inductive circuit.

9. An apparatus comprising:
magnetic structures that define a resonant cavity;
a source to provide particles to the resonant cavity;
a voltage source to provide radio frequency (RF) voltage to the resonant cavity;
a phase detector to detect a difference in phase between the RF voltage and a resonant frequency of the resonant cavity that changes over time; and
control circuitry, responsive to the difference in phase, to control the voltage source so that a frequency of the RF voltage substantially matches the resonant frequency of the resonant cavity, the control circuitry comprising:
an integrator to receive an output of the phase detector and to sum the output over time
a filter to generate a control signal for the voltage source based on an output of the integrator, the control signal for causing the voltage source to change the frequency of the RF voltage in accordance with the difference in phase, and
circuitry to present the phase detector with substantially constant frequencies over at least part of a frequency range that the resonant cavity is swept.

10. The apparatus of claim 9, wherein the resonant cavity comprises:
a first dee to receive the RF voltage; and
a second dee that is electrically connected to ground;
wherein a space between the first dee and the second dee forms a gap; and
wherein the first dee and the second dee define a tunable resonant circuit configured to create an oscillating electric field across the gap in response to the RF voltage.

11. An apparatus comprising:
magnetic structures that define a resonant cavity;
a source to provide particles to the resonant cavity;
a voltage source to provide radio frequency (RF) voltage to the resonant cavity;
a phase detector to detect a difference in phase between the RF voltage and a resonant frequency of the resonant cavity that changes over time; and
control circuitry, responsive to the difference in phase, to control the voltage source so that a frequency of the RF voltage substantially matches the resonant frequency of the resonant cavity, the control circuitry comprising:
an integrator to receive an output of the phase detector and to sum the output over time;
a filter to generate a control signal for the voltage source based on an output of the integrator, the control signal for causing the voltage source to change the frequency of the RF voltage in accordance with the difference in phase, and circuitry to present the phase detector with substantially constant frequencies over at least part of a frequency range that the resonant cavity is swept.

12. Circuitry to substantially match an input voltage to a resonant cavity to a resonant frequency of the resonant cavity, where the resonant frequency sweeps frequencies over time, the circuitry comprising:
- a phase detector to detect a difference in phase between the resonant frequency and the input voltage, the phase detector outputting a first signal that corresponds to the difference;
- an integrator and filter circuit to generate a control signal in response to the first signal;
- a voltage controlled oscillator to regulate the input voltage in response to the control signal; and
- circuits to present the phase detector with substantially constant frequencies over at least part of a frequency range of the resonant frequency.

13. The circuitry of claim 12, wherein the phase detector is configured to obtain the resonant frequency from one of a voltage of the resonant cavity and a current of the resonant cavity.

14. The circuitry of claim 12, wherein the resonant frequency sweeps over a frequency range of about 30 megahertz (MHz) and about 300 MHz in about a predefined time; and
wherein the integrator and filter circuit comprises a low-pass filter having a cutoff frequency that is inversely proportional to the predefined time.

15. The circuitry of claim 12, wherein the resonant cavity is part of a synchrocyclotron that is configured to accelerate protons from the resonant cavity.

16. The circuitry of claim 12, further comprising:
a pickup element associated with the resonant cavity, the pickup element for obtaining a signal corresponding to the resonant frequency, the phase detector for receiving the signal from the pickup element.

17. The circuitry of claim 12, wherein the pickup element is capacitive and the signal comprises a voltage signal; or
wherein the pickup element is inductive and the signal comprises a current signal.

18. A method of matching an input voltage to a resonant cavity to a resonant frequency of the resonant cavity, where the resonant frequency sweeps frequencies over time, the method comprising:
- in a phase detector, detecting a difference in phase between the resonant frequency and the input voltage, a first signal corresponding to the difference;
- in a loop filter and integrator, generating a control signal in response to the first signal; and
- using a voltage controlled oscillator, regulating the input voltage in response to the control signal;
- where circuitry is used to present the phase detector with substantially constant frequencies over at least part of a frequency range of the resonant frequency.

19. The method of claim 18, wherein detecting the difference in phase comprises obtaining the resonant frequency from one of a voltage of the resonant cavity and a current of the resonant cavity.

20. The method of claim 18, wherein the resonant frequency sweeps over a frequency range of about 30 megahertz (MHz) and about 300 MHz in about a predefined time; and
wherein the loop filter and integrator comprises a low-pass filter circuit that has a cutoff frequency that is inversely proportional to the predefined time.

21. The method of claim 18, wherein the resonant cavity is part of a synchrocyclotron that is configured to accelerate protons from the resonant cavity.

22. The method of claim 18, further comprising:
obtaining a signal corresponding to the resonant frequency, the difference in phase between the resonant frequency and the input voltage being determined based on the signal corresponding to the resonant frequency.

* * * * *

UNITED STATES PATENT AND TRADEMARK OFFICE
CERTIFICATE OF CORRECTION

PATENT NO.        : 8,933,650 B2
APPLICATION NO.   : 11/948359
DATED             : January 13, 2015
INVENTOR(S)       : Charles D. O'Neal, III et al.

Page 1 of 1

It is certified that error appears in the above-identified patent and that said Letters Patent is hereby corrected as shown below:

In The Claims

Column 9, Line 45, In Claim 1, delete "time" and insert -- time; --, therefor.

Column 10, Line 31, In Claim 9, delete "time" and insert -- time; --, therefor.

Columns 10-11, Lines 49-67 (Col. 10), 1-3 (Col. 11), In Claim 11, delete "An apparatus comprising: magnetic structures that define a resonant cavity;

a source to provide particles to the resonant cavity;

a voltage source to provide radio frequency (RF) voltage to the resonant cavity;

a phase detector to detect a difference in phase between the RF voltage and a resonant frequency of the resonant cavity that changes over time; and control circuitry, responsive to the difference in phase, to control the voltage source so that a frequency of the RF voltage substantially matches the resonant frequency of the resonant cavity, the control circuitry comprising:

an integrator to receive an output of the phase detector and to sum the output over time;

a filter to generate a control signal for the voltage source based on an output of the integrator, the control signal for causing the voltage source to change the frequency of the RF voltage in accordance with the difference in phase, and circuitry to present the phase detector with substantially constant frequencies over at least part of a frequency range that the resonant cavity is swept."

and insert

-- The apparatus of claim 9, further comprising a voltage pickup element associated with the resonant cavity, the voltage pickup element for obtaining a voltage of the resonant cavity and for providing the voltage to the phase detector, the voltage corresponding to the resonant frequency. --, therefor.

Signed and Sealed this
Sixteenth Day of August, 2016

Michelle K. Lee
*Director of the United States Patent and Trademark Office*